US011941773B2

(12) United States Patent
Sadoudi et al.

(10) Patent No.: US 11,941,773 B2
(45) Date of Patent: Mar. 26, 2024

(54) METHOD FOR DESIGNING A THREE-DIMENSIONAL MESH IN A 3D SCENE

(71) Applicant: DASSAULT SYSTEMES, Vélizy-Villacoublay (FR)

(72) Inventors: Yani Sadoudi, Vélizy-Villacoublay (FR); Frédéric Letzelter, Vélizy-Villacoublay (FR); Christophe Dufau, Vélizy-Villacoublay (FR)

(73) Assignee: DASSAULT SYSTEMES, Vélizy-Villacoublay (FR)

( * ) Notice: Subject to any disclaimer, the term of this patent is extended or adjusted under 35 U.S.C. 154(b) by 101 days.

(21) Appl. No.: 17/377,076

(22) Filed: Jul. 15, 2021

(65) Prior Publication Data
US 2022/0020224 A1 Jan. 20, 2022

(30) Foreign Application Priority Data

Jul. 15, 2020 (EP) .................................... 20305818

(51) Int. Cl.
G06T 19/20 (2011.01)
G06F 3/0346 (2013.01)
(Continued)

(52) U.S. Cl.
CPC ............ *G06T 19/20* (2013.01); *G06F 3/0346* (2013.01); *G06F 30/10* (2020.01); *G06T 17/20* (2013.01);
(Continued)

(58) Field of Classification Search
None
See application file for complete search history.

(56) References Cited

U.S. PATENT DOCUMENTS 6,426,745 B1 * 7/2002 Isaacs ................. G06F 3/04845
345/619
2004/0046769 A1 3/2004 Arvin et al.
2018/0182177 A1 * 6/2018 Rum ..................... G06F 3/0486

FOREIGN PATENT DOCUMENTS

EP 3 340 023 A1 6/2018

OTHER PUBLICATIONS

"4. The PolyMesh Editor Window", Dec. 31, 2006, XP055756319, http://aoisp.sourceforge.net/plugins/polymesh/Manual/html/ar01s04.html, 9 pages.
(Continued)

Primary Examiner — Yi Wang
(74) Attorney, Agent, or Firm — Oblon, McClelland, Maier & Neustadt, L.L.P.

(57) ABSTRACT

A computer-implemented method for designing a three-dimensional (3D) mesh in a 3D scene. The method comprises displaying a 3D mesh in a 3D scene and providing a global orientation and selecting, with a pointing device, one or more vertices of the 3D mesh, thereby forming a set of one or more vertices. The method comprises computing at least one picking zone that surrounds each vertex of the set. The method comprises providing a first manipulator for controlling a displacement of each vertex of the set along one or more NUV directions and determining whether the pointing device is maintained within the picking zone. If not, the method comprises providing a second manipulator for controlling a displacement of the one or more vertices of the set along one or more directions defined by the global orientation. The method improves user interactions for switching back and forth a first and second manipulators.

19 Claims, 12 Drawing Sheets

(51) Int. Cl.
G06F 30/10 (2020.01)
G06T 17/20 (2006.01)
(52) U.S. Cl.
CPC .. *G06T 2200/24* (2013.01); *G06T 2219/2016* (2013.01)

(56) References Cited

OTHER PUBLICATIONS

European Search Report dated Dec. 17, 2020 issued in corresponding European patent application No. EP20305818.

* cited by examiner

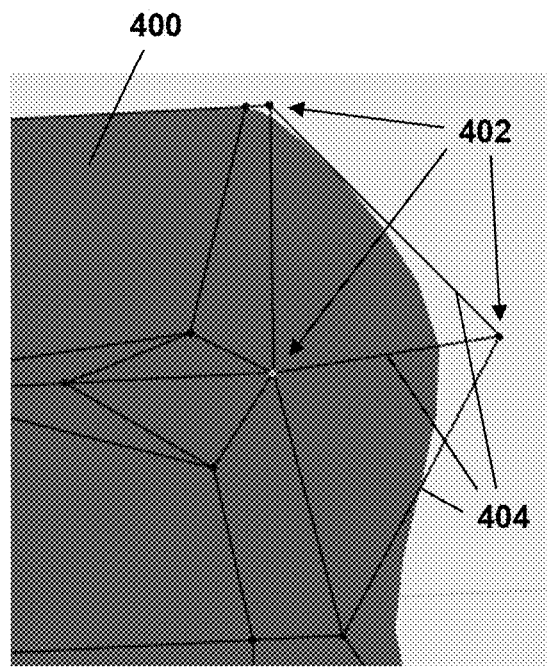 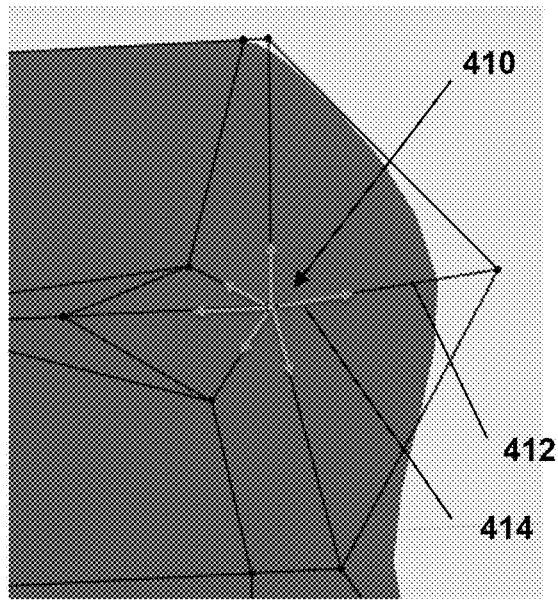
FIG. 7     FIG. 8
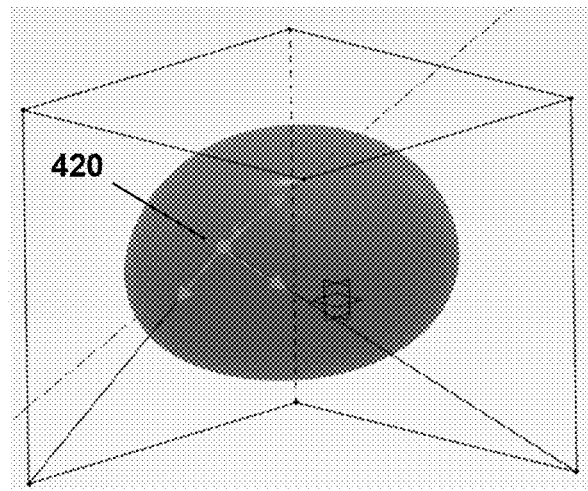
FIG. 9

METHOD FOR DESIGNING A THREE-DIMENSIONAL MESH IN A 3D SCENE

CROSS-REFERENCE TO RELATED APPLICATIONS

This application claims priority under 35 U.S.C. § 119 or 365 to European Application No. 20305818.5, filed Jul. 15, 2020. The entire contents of the above application(s) are incorporated herein by reference.

FIELD

The disclosure relates to the field of computer programs and systems, and more specifically to a method, system and program for designing a three-dimensional (3D) mesh in a 3D scene.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

The disclosure relates to CAD software. More specifically, it relates to any CAD software allowing a user to manipulate a 3D object represented by a set of geometrical elements such as vertices, edges and faces in a 3D scene. The set of geometrical elements forms a 3D mesh of the 3D object.

The user can modify the shape of the 3D object by manipulating the 3D mesh representing the 3D object. An example of a 3D mesh of a 3D object is illustrated in FIG. 4. In this example, the 3D object is a sphere 310, and the 3D mesh 314 that represents the sphere object is a cube 314. Another example of a 3D mesh is illustrated in FIG. 7 where the 3D mesh comprises vertices 402 connected with edges 404 that form the shape of the 3D object 400. By modifying the position of vertices of the 3D mesh, the user can modify the shape of the object that the 3D mesh represents.

Tools are provided to the user for manipulating the vertices, edges, faces of the 3D mesh that represents the 3D object. One of the most common tools allows manipulating the 3D object or part of it along a specific axis using a manipulator commonly referred to as a "robot". An example of a "robot" manipulator is illustrated in FIGS. 3 to 6. This "robot" manipulator 300 is a manipulator representing an axis system 302 having 3 axes (X, Y, Z) and the user can use any of its 3 axes to manipulate the object along the directions defined by the axis system. The axis system of the robot generally uses by default a global axis system 312 of the 3D scene, such as a global axis system of the 3D object or of a product comprising the 3D object that is modified. The "robot" manipulator can be remotely manipulated for manipulating the object 310, as illustrated in FIG. 4. Alternatively, the "robot" manipulator can be provided to a selected vertex, as illustrated in FIG. 5. By selecting a vertex 322 of the mesh 314, the user can user interact with one of the three axes of the "robot" 320 to displace the vertex 322 along the direction of the selected axis, thereby modifying the shape of the 3D object 310. In the example of FIG. 5, the "robot" manipulator 320 is provided to the vertex 322, and the user interacts with the Z axis 330 of the robot for displacing the selected vertex 322 along the direction of the Z axis 330, as illustrated in FIG. 6 after the displacement.

A vertex can also be displaced along directions of its incident mesh lines (referred to as "UV" directions) using a manipulator commonly referred to as a "UV" manipulator. An example of an UV manipulator is illustrated in FIG. 8 where the user can move a selected vertex 410 along its incident mesh lines 412. The incident mesh lines are the incident edges of the given selected vertex. The directions defined by the incident edges are called the UV directions of the vertex. The user can user interact with one of the UV direction of the vertex for displacing the selected vertex along the UV direction. The manipulator 414 is thus embodied by the directions of each incident edges of the vertex (i.e. each UV direction). Another example of such a manipulator is illustrated in FIG. 9 for the selected vertex 322 of the 3D mesh 314 of FIGS. 4 to 6. In this example, the manipulator 420 comprises three UV directions defined by each incident edge.

The main drawback of these solutions for designing a 3D mesh is productivity. Indeed, the user permanently needs to switch between the different tools for designing the object. Such cases are usually solved by creating a mode for each tool that can be turned on or off for activating or deactivating each tool, e.g. using a pointing device or a keyboard shortcut. Hence, the user constantly needs to manually switch between the available tools, which is not ergonomic. For instance, it induces numerous movements of a pointing device for turning on an off the modes before and/or after each manipulation of the object, or numerous uses of keyboard shortcuts when such keyboard shortcuts are defined. Additionally, switching between different modes tends to cause manipulations mistakes as the user can be perturbated by the switching and thus wrongly use one mode instead of another when the desired mode is not activated.

Moreover, if several modes are activated at the same time, it can be difficult for the user to properly perform a mesh manipulation. For instance, if the "robot" manipulator and the manipulator of the UV manipulation mode are activated together, it can be difficult for the user to select one direction of manipulation since the axis system of the "robot" and the UV directions would be displayed in the same place, which would make difficult the selection of one axis among those provided by the "robot" and the "UV" manipulator. This problematic situation is illustrated in FIG. 10. If the axis of a first "robot" manipulator 500 and the UV directions of a second manipulator 502 are superposed or in close proximity, it is difficult for the user to pick the axis or the NUV direction he/she wants to manipulate.

In addition, switching between "robot" and "UV" modes all the time is a real productivity issue as the user, in the creation process, needs these tools. Switching between "robot" and "UV" modes also causes ergonomic problems as the frequent repetitive motions of the hand for selecting another mode can cause muscle pains and/or strains.

Within this context, there is still a need for improving user interactions for switching back and forth a first and second manipulators.

SUMMARY

It is therefore provided a computer-implemented method for designing a three-dimensional (3D) mesh in a 3D scene. The method comprises displaying a 3D mesh in a 3D scene. The method comprises providing a global orientation. The method comprises selecting, with a pointing device, one or more vertices of the 3D mesh, thereby forming a set of one or more vertices. The method comprises computing at least one picking zone that surrounds each vertex of the set. The method comprises providing a first manipulator for controlling a displacement of each vertex of the set along one or more NUV directions. The method comprises determining whether or not the pointing device is maintained within the picking zone. If not, the method comprises providing a second manipulator for controlling a displacement of the one or more vertices of the set along one or more directions defined by the global orientation.

The method may comprise one or more of the following:
  after the providing the second manipulator, determining that the pointing device is again within the at least one picking zone and providing the first manipulator;
  providing the first manipulator may further comprise withdrawing the second manipulator;
  providing the second manipulator may further comprise withdrawing the first manipulator;
  providing the first manipulator may further comprise determining the vertex of the set that is the closest to the pointing device and providing the first manipulator to the determined vertex;
  repeating the computing of the at least one picking zone during or after each displacement of the one or more vertices of the set;
  the selecting, with a pointing device, of one or more vertices of the 3D mesh may be performed by user interacting with the pointing device on at least one vertex of the mesh, thereby selecting the at least one vertex of the mesh and/or user interacting with the pointing device on at least one edge of the mesh, thereby selecting the two vertices of the at least one edge and/or user interacting with the pointing device on at least one face of mesh, thereby selecting the vertices that belong to the at least one face;
  the first manipulator may comprise at least one graphical element representing one of the NUV directions. The at least one graphical element may control a displacement of at least one vertex of the set along the NUV direction represented by the at least one graphical element. The method may comprise, after the providing of the first manipulator, user interacting with the at least one graphical element of the first manipulator, displacing the at least one vertex of the set along the NUV direction in response to a movement of the pointing device. The computed at least one picking zone may be deactivated during the movement. The method may further comprise, for each vertex of the set with no NUV direction that is the same as the NUV direction represented by the at least one graphical element, displacing the vertex along one of its NUV direction that is the closest to the NUV direction represented by the at least one graphical element;
  updating the position of the first manipulator based on a new position of the at least one vertex of the set along the NUV direction that is displaced in response to a movement of the pointing device;
  for each vertex of the set with no NUV direction that is the same as the NUV direction represented by the at least one graphical element, displaying a graphical element representing the NUV direction of the vertex that is the closest to the NUV direction represented by the at least one graphical element of the first manipulator;
  the second manipulator may be a robot; and/or
  the computing of the at least one picking zone may comprise computing one picking zone for each vertex of the set, and/or wherein the computed at least one picking zone may be a delimited surface such as a circle when the pointing device is a two-dimensional (2D) pointing device, or may be a volume such as a sphere when the pointing device is a 3D pointing device.

It is further provided a computer program comprising instructions for performing the method.

It is further provided a computer readable storage medium having recorded thereon the computer program.

It is further provided a system comprising a processor coupled to a memory and a display and a pointing device, the memory having recorded thereon the computer program.

BRIEF DESCRIPTION OF THE DRAWINGS

Embodiments of the disclosure will now be described, by way of non-limiting example, and in reference to the accompanying drawings, where:

FIG. 7 shows an example of a selection of a vertex;
FIG. 8 shows an example of a first manipulator for controlling a displacement of each vertex of the set along NUV directions;
FIG. 9 shows an example of the first manipulator of FIG. 8 provided to a vertex of the same 3D mesh in FIGS. 5 and 6.

DETAILED DESCRIPTION

Figure 1:
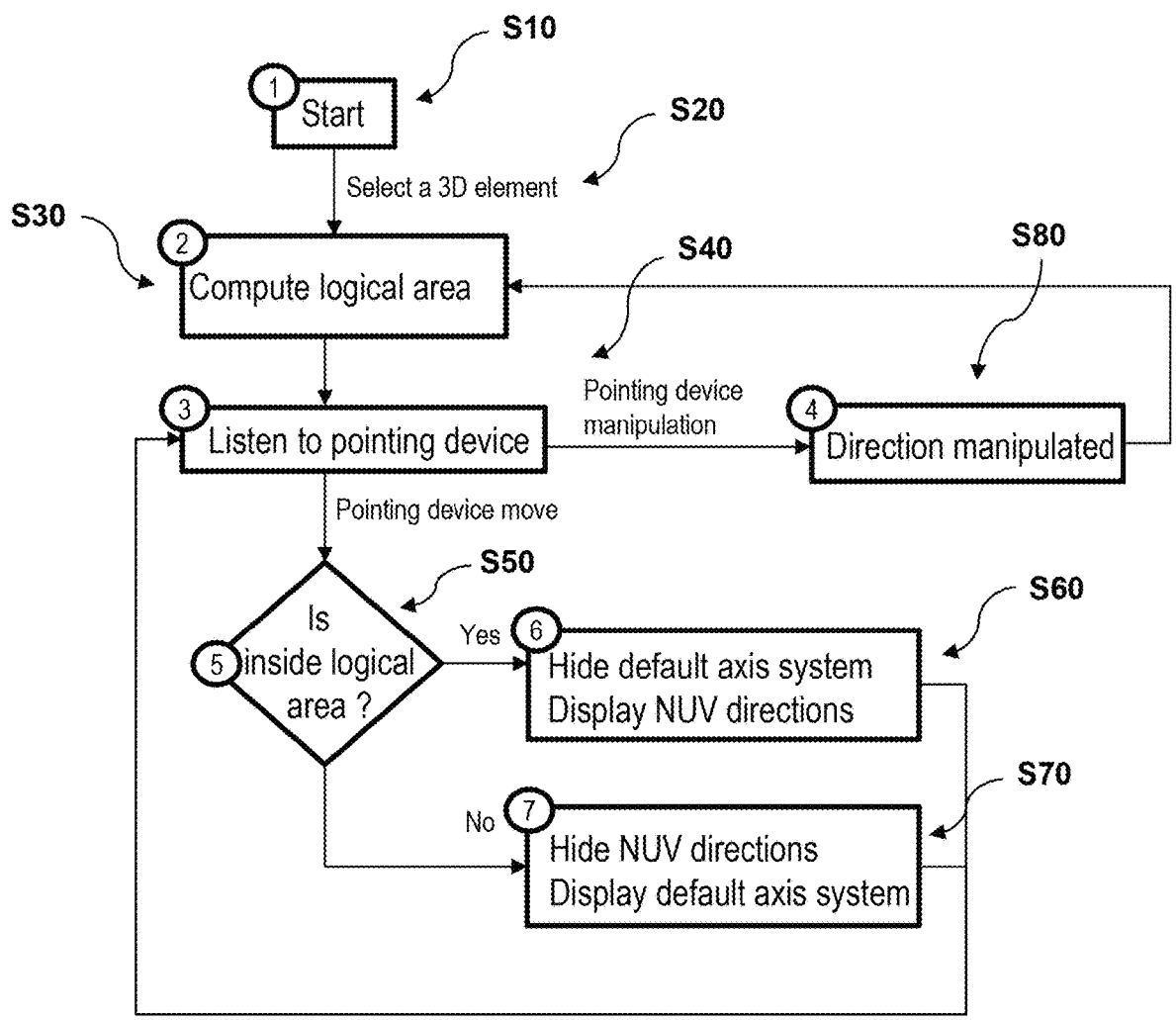
FIG. 1 shows a flowchart of an example of the method.

With reference to the flowchart of FIG. 1, it is proposed a computer-implemented method for designing a three-dimensional (3D) mesh in a 3D scene. The 3D mesh may represent a 3D object the user wishes to modify. The 3D mesh may be any type of mesh, such as a polygonal mesh or a base mesh. The method comprises displaying S10 the 3D mesh. The 3D mesh may be e.g. displayed on a graphical user interface. The method comprises S10 providing a global orientation. The global orientation may be any type of axis system that orients the 3D mesh. For instance, the global orientation may be a global orientation of the 3D mesh, a global orientation of the 3D object the mesh represents, or a global orientation of a 3D scene comprising the 3D object represented by the 3D mesh. The global orientation may also be user defined, e.g. the user may select each axes of the global orientation. The global orientation may also be displayed on the graphical user interface. The steps of displaying the 3D mesh and providing the global orientation may be concomitantly performed, or the displaying performed before the providing or the providing performed before the displaying.

The method comprises selecting S20, with a pointing device, one or more vertices of the 3D mesh, thereby forming a set of one or more vertices. The selection of the one or more vertices may be performed upon user interaction, e.g. by positioning the pointing device on each vertex or selecting several vertices using a drag and drop selection method. A pointing device is an input interface (specifically a human interface device) that allows a user to input spatial (i.e., continuous and multi-dimensional) data to a computer. Graphical user interfaces (GUI) such as those in CAD systems allow the user to control and provide data to the computer using physical gestures of the user by moving a hand-held mouse or similar device across the surface of the physical desktop and activating switches on the mouse. Alternatively, GUIs allow the user to control and provide data to the computer using physical gestures of the user by moving a one or more fingers or similar device (e.g. stylet) across the surface of the touch sensitive screen and performing gestures on the touch-sensitive screen. Alternatively, GUIs in virtual reality (VR) allow the user to control and provide data to the computer using physical gestures of the user by moving input devices such as 3D mouse, wired gloves, motion controllers, optical tracking sensors in the VR environment and performing gestures in the VR environment. Movements of the pointing device may be shown on the screen by movements of the pointer (or cursor) and other visual changes. Common gestures are point and click and drag and drop. While the most common pointing device by far is the mouse, many more devices have been developed for sensitive touch screen (called gestures) and VR environments. However, the term "mouse" is commonly used as a metaphor for devices that move the cursor. For instance, the pointing device may be any 2D pointing device (a mouse, a touch or a stylus) or any 3D pointing device (e.g. a Virtual Reality controller). Any other method for selecting one or more vertices may be used; independently of the method used, the system performing the method is aware, as a result of the selection, that a displacement of the vertices will be performed at a later stage. The method may comprise selecting any number of vertices, such as one vertex, two vertices or any integer number n>2 of vertices, thereby forming a set of respectively one, two or n vertices. The set of one or more vertices may e.g. be registered on a database. For instance, forming the set of one or more vertices may comprise mapping in the database a data representing the set with each of the selected one or more vertices.

The method comprises computing S30 at least one picking zone that surrounds each vertex of the set. A picking zone is a zone of the graphical user interface where the user can position the pointing device for performing a particular action.

The picking zone may be of any size and any shape. In examples, a picking zone may delimit any zone on the graphical user interface. A zone may be an area or a volume. This may depend on the graphical user interface (GUI) the user interacts with. For instance, if the GUI is a two-dimensional (2D) GUI, a picking zone may delimit an area. As another example, if the GUI is a 3D GUI (e.g. in Virtual Reality), a picking zone may delimit a volume.

In examples, each computed picking zone have the same size and/or shape. In other words, each picking zone may have the same geometry in the GUI. Examples will be discussed in reference to FIGS. 11 and 12 herein below.

The picking zone may be invisible (that is, not displayed) on the graphical user interface to the user or alternatively may be displayed.

The size of the picking zone may e.g. be selected such as the pointing device is within the picking zone after selecting a vertex of the set. In this case, the pointing device may e.g. be within the computed picking zone that surrounds the selected vertex. Alternatively, or additionally, the pointing device may be motionless until the picking zone corresponding to the selected vertex is computed. If the screen is touch sensitive, the pointing device may e.g. remain at a location of the touch when the selection is performed until the picking zone corresponding to the selected vertex is computed.

In examples, one picking zone may be computed for each vertex of the set. In this case, the method may comprise computing a number of picking zone that is equal to the number of vertices of the set (i.e. as many picking zones as selected vertices).

In examples, a picking zone may be computed for more than one vertex of the set, e.g. two vertices or any number of vertices of the set (such as for all the vertices of the set). In this case, the method may comprise computing a number of picking zones that is lower than the number of vertices of the set. For instance, a single picking zone may surround two or more vertices that are close together, e.g. the distance between two or more vertices is smaller than a predetermined distance. The distance may be, but not limited to, an Euclidian distance or a 3D distance . . . . The method may thus further comprise first determining groups of vertices that are that are close together and then computing a picking zone for each group of vertices; being understood that a group of vertices may comprise only one vertex if the vertex has no close vertex.

The method comprises providing S40 a first manipulator for controlling a displacement of each vertex of the set along one or more NUV directions. The NUV directions comprises the UV directions of the vertex (defined by the incident edges of the vertex) and a normal N direction from a surface of the object at the vertex. Hence, the first manipulator (for controlling the displacement along NUV directions) is an enhanced UV manipulation mode. In this enhanced UV manipulation mode (referred to as NUV manipulation mode), the first manipulator allows controlling the displacement of vertices of the 3D mesh along each NUV direction (i.e. along the UV directions and the normal N direction). In this NUV manipulation mode, the user can thus move a selected vertex along the UV directions of the vertex and along the normal direction N at the vertex, e.g. by user interacting with the pointing device on one of the NUV direction. For instance, the user may interact on one of the NUV directions by positioning the pointing device on or adjacent to one of the NUV directions and performing a click on a button of the pointing device (or a touch on one or the NUV direction if the screen is touch sensitive). The user interaction on the NUV direction may trigger a displacement function along this direction. The displacement function may e.g. displace the one or more vertices along this direction with a distance length proportional to a move of the pointing device. The displacement function may displace the one or more vertices along the two orientations of this direction. The user may thus control the displacement of the one or more vertices using the displacement function by performing, after user interacting with one of the NUV direction, a move of the pointing device. For instance, the user may click on or near to a NUV direction and move the pointing device in a direction for displacing the one or more vertex along this NUV direction. The one or more vertices may be displaced with a displacement length that is proportional to the distance of the move of the pointing device. For instance, the distance of the pointing device may be the distance of the projection of the move of the pointing device on the direction along which the one or more vertices are displaced.

In examples, the one or more NUV directions may comprise all the UV directions defined by each incident edge of a vertex of the set and the normal N direction at the vertex. The normal N direction to a surface at a point is the direction perpendicular to the tangent plane of the surface at that point. The normal N direction at a vertex may be the normal N direction to the surface of the object that the 3D mesh represents at the point of the surface corresponding to the vertex. The normal N direction may be represented by a normal N vector. For instance, the normal N direction may be computed by calculating a sum of the normal vectors of each incident face of the vertex, thereby calculating an average normal vector of the mesh at this vertex.

In examples, the one or more NUV directions may be selected among the UV directions of the one or more selected (S20) vertices of the set and the normal N direction at the one or more selected (S20) vertices. In examples, the one or more NUV directions may be selected among the UV directions of the vertex of the set that is the closest to the pointing device when the selecting step has been accomplished and the normal N direction at this vertex.

The method comprises determining S50 whether or not the pointing device is maintained within the at least one picking zone. "The pointing device is maintained within the at least one picking zone" means that the pointing device remains within the at least one picking zone that surrounds the one or more selected vertices of the set or within the picking zone of the vertex that is the closest to the pointing device at the end of the selection of the one or more vertices from the moment the picking zone have been created.

The method determines if the pointing device is encompassed and/or surrounded inside the picking zone. For instance, each picking zone may delimit a zone on the graphical user interface where a presence or an absence of a cursor is detected, e.g. when the pointing device is a mouse. Alternatively, or additionally, the picking zone may delimit a zone where a presence or an absence of the user finger is detected when the graphical user interface is displayed on a touch sensitive screen.

In examples, the method may determine whether or not the pointing device is still encompassed and/or surrounded inside the at least one picking zone. Indeed, after selecting with the pointing device the one or more vertices of the 3D mesh, the pointing device is inside the computed at least one picking zone since the at least one picking zone surrounds each vertex of the set and the selection may comprise user interacting with the one or more vertices (i.e. e.g. positioning the pointing device in proximity with the one or more vertices).

If the method has determined that the pointing device is not maintained within the at least one picking zone, the method comprises providing S70 a second manipulator for controlling 580 a displacement of the one or more vertices of the set along one or more directions defined by the provided global orientation. "The pointing device is not maintained within the at least one picking zone" means that the pointing device is no more within the picking zone, e.g. the user displaced the pointing device. For instance, the user displaced the mouse cursor on the graphical user interface or moved his/her finger on the screen.

In examples, the second manipulator may enable the control of the displacement of the one or more vertices of the set along each direction of the global orientation, e.g. upon user interaction on the second manipulator. In example, the second manipulator may be a robot, e.g. as discussed in reference to FIGS. 3 to 6.

In examples, the method may provide the second manipulator anywhere in the graphical user interface. For instance, the method may provide the second manipulator at a location that is on or adjacent to a first location when the pointing device is outside of the at least one picking zone. In this case, the user may user interact on one of the directions of the second manipulator by positioning the pointing device on or adjacent to one of the directions of the second manipulator, thereby triggering a displacement function along this direction. The displacement function may e.g. displace the one or more vertices along this direction with a distance length proportional to a move of the pointing device, as for the first manipulator.

In examples, the method may provide the second manipulator at the current location of the pointing device. In these examples, the second manipulator may follow the pointing device, e.g. the method may comprise updating the position of the second manipulator for each new location of the pointing device. For instance, if the screen is touch sensitive, the pointing device may follow the moves of the user finger or a stylus. In this case, the second manipulator may be "gesture based", as disclosed in the European Patent application EP 3 340 023 A1. "Gesture base" means that each direction of the second manipulator is activated (i.e. selected for controlling the displacement of the vertex along this direction) according to a specific gesture of the user. For instance, the method may comprise detecting a drag operation performed by the user using the pointing device (the drag operation comprising a translation of the pointing device) and selecting an axis of the second manipulator as a function of said translation of the pointing device. Then, the method may comprise performing a displacement of the one or more vertices, the displacement depending on the selected axis and by a length of the translation of the pointing device along the selected axis.

The method improves user interactions for switching back and forth a first and second manipulators. Notably, the method comprises providing the first manipulator when the pointing device remains within the computed at least one picking zone and providing the second manipulator when the method determines that the pointing device is not maintained within the at least one picking zone. Therefore, the first manipulator and the second manipulator are provided depending on the position of the pointing device about the one or more selected vertices, which improves the ergonomic of the user. Indeed, the user can thus control the selected one or more vertices using both the first and second manipulators. For instance, the user can use first the first manipulator and then move the pointing device further away from the selected vertices for using the second manipulator. In particular, the method reduces the number of user interaction since the user no longer needs to perform movements of the pointing device for turning on an off the modes that provide the first and second manipulators, and only performs local pointing device moves (i.e. around the place where the 3D mesh is displayed) for using both the first and second manipulators. This improves drastically the user's productivity.

Additionally, switching between the two modes depending on the pointing device location improves the ergonomic since the first manipulator is more relevant when the pointing device is close to the selected one or more vertices, and because the second manipulator does not necessarily need to be in such a close location. Indeed, the first manipulator allows controlling the one or more vertices along the NUV directions that are defined based on the incident edges (i.e. that are defined locally). Because the NUV manipulation axis are computed using the mesh lines and normal at a selected vertex, they can be in any directions. As a consequence, the best way to avoid picking conflicts between two of these directions is to pick the manipulated direction directly around the selected one or more vertices (i.e. locally), not remotely. Displaying the first manipulator when the pointing device is close to the selected elements improve ergonomics as the user can more easily comprehend the one or more NUV directions the one or more selected elements will move along. On the other hand, the second manipulator does not require such a local knowledge of the incident edges of the vertex since the second manipulator uses the direction of the global orientation. The second manipulator makes sense anywhere on the screen as its definition does not depend on the selected one or more vertices. Additionally, since the first manipulator and the second manipulator are provided depending on the pointing device location, potential manipulation errors that would be induced otherwise are avoided. Indeed, the most relevant manipulator is provided depending on the position of the pointing device (the first manipulator locally and the second otherwise). This saves the user from having to constantly check which mode is activated which can lead to many manipulation mistakes.

Furthermore, the user, in the creation process, needs both the first and second manipulators and is therefore often switching between the two modes all the time. Therefore, the method is particularly efficient for the user's interactions as the method allows automatically performing the switching between the two modes depending on the position of the pointing device. By automatically providing the most relevant manipulator depending on the position of the pointing device, the method therefore considerably improves the ergonomic for the user.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates 3D object, also commonly referred to as "modeled objects". A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS) or subdivision surfaces. Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semi-conductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round) and/or standard surfacing features (e.g. sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (e.g. a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed of a plurality of components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 2:
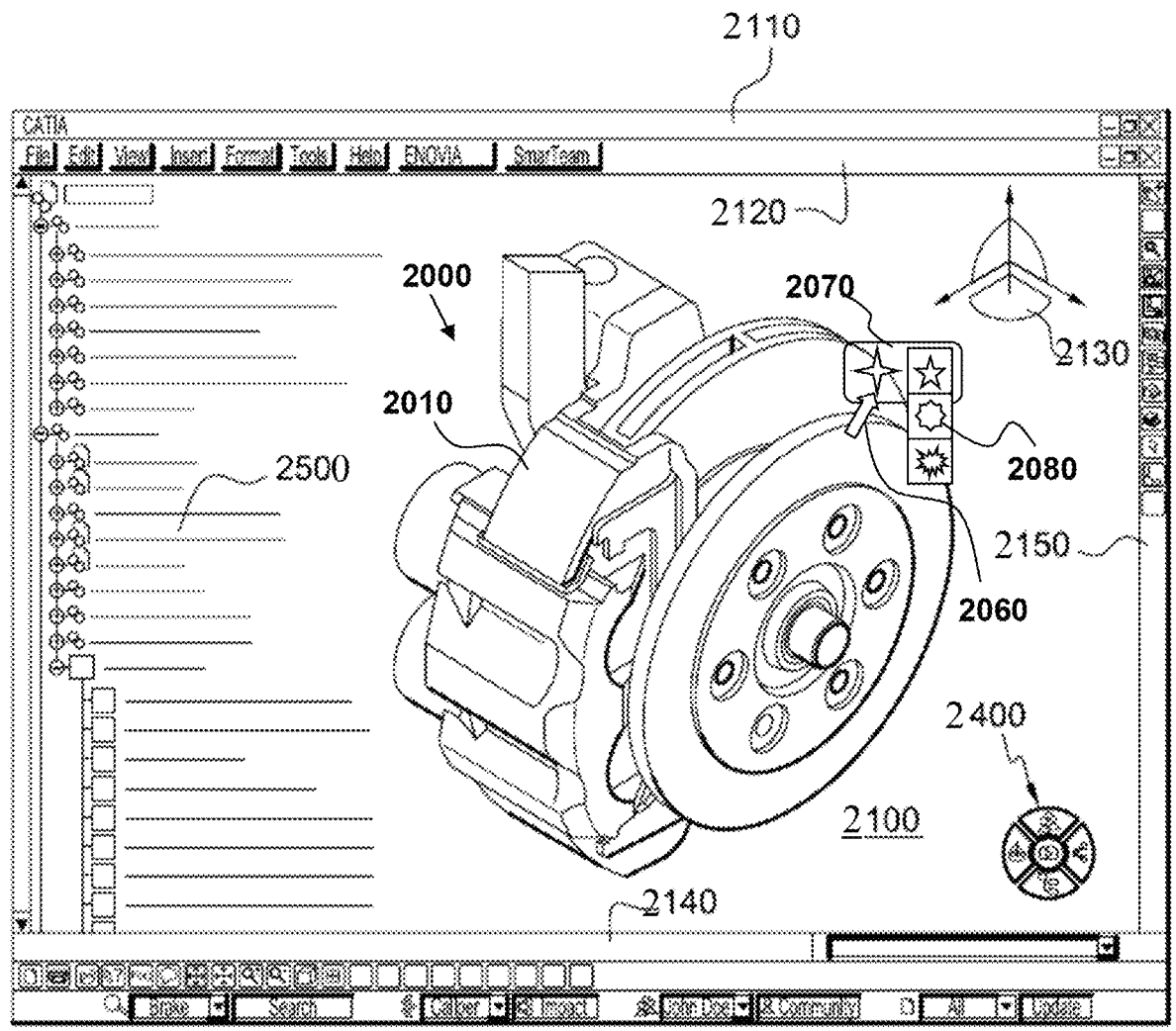
FIG. 2 shows an example of a graphical user interface of the system.
Figure 3:
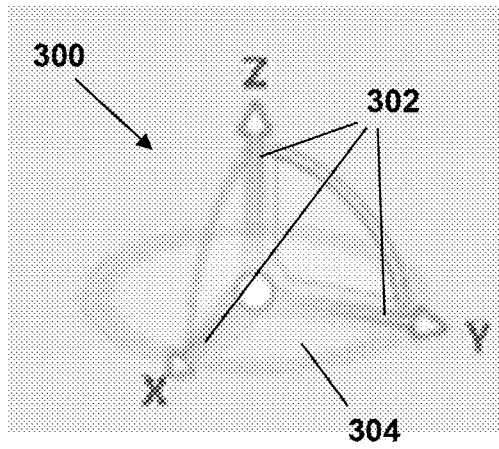
FIGS. 3, 4, 5 and 6 show an example of a "robot" manipulator.
Figure 4:
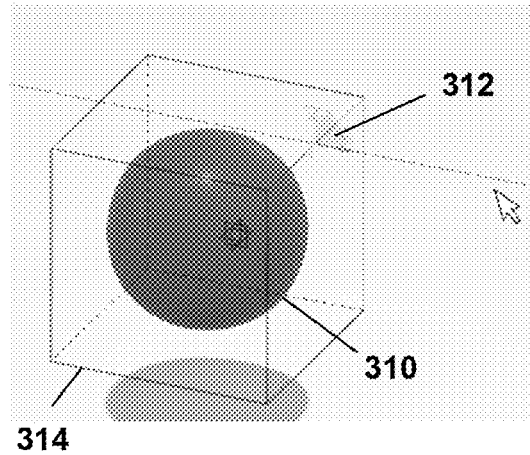
Figure 5:
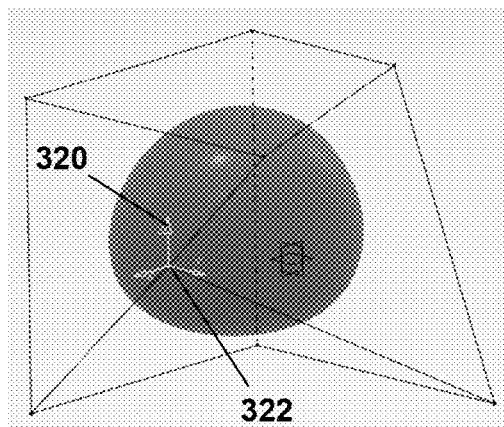
Figure 6:
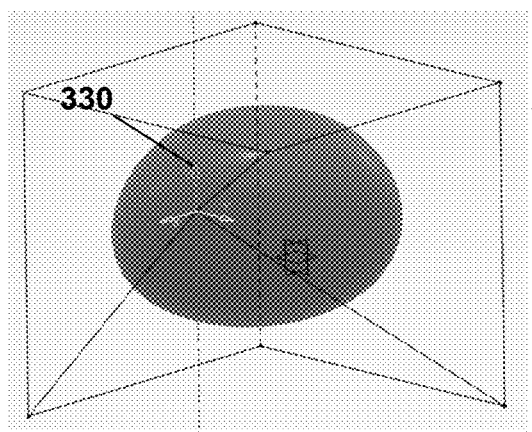
Figure 10:
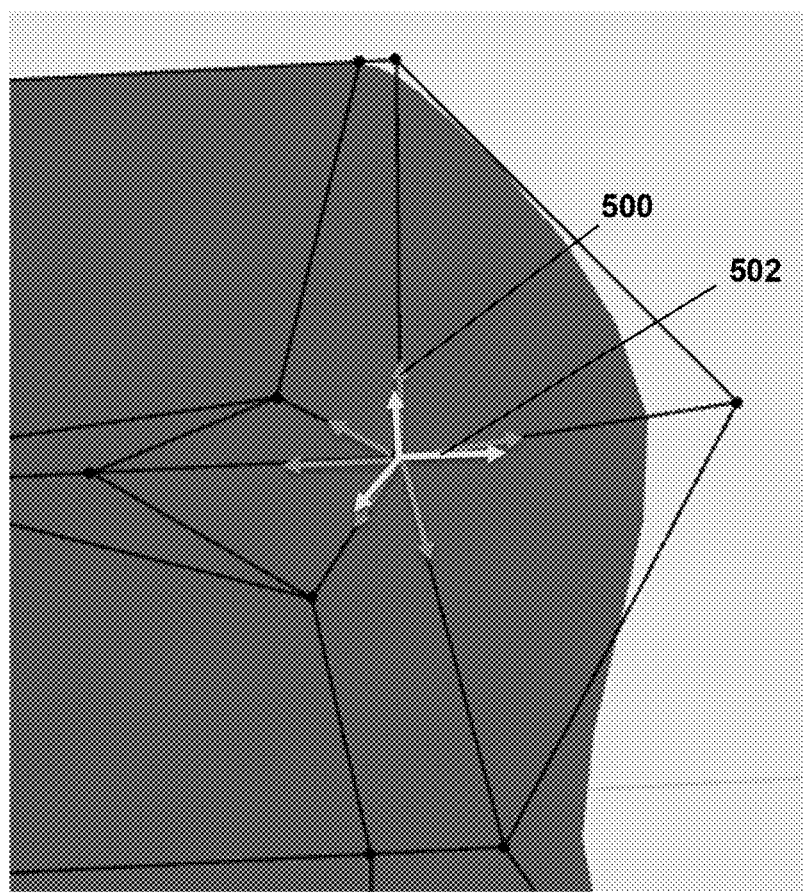
FIG. 10 shows an example of the first manipulator of FIG. 8 and the "robot" manipulator of FIG. 3 provided together.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

In examples, the method may further comprise, after the providing S70 the second manipulator, determining S50 that the pointing device is again within the at least one picking zone and providing S60 the first manipulator. In other words, it is determined that the pointing device is returned to the at least one picking zone. Providing S60 the first manipulator here means that the first manipulator is provided again: indeed, the first manipulator has been provided a first time S40, and if the pointing device returns within the at least one picking zone after leaving the at least one picking zone, the method provides again the first manipulator (i.e. a second time). In examples, if the pointing device is within a first picking zone that surrounds a given vertex of the set and leaves this first picking zone, the second manipulator is thus provided. At this time, if the pointing device returns within this first picking zone, the method provides the first manipulator again (i.e. a second time). The method may also provide the first manipulator again if the pointing device returns within another picking zone of the computed at least one picking zone, e.g. a second picking zone that surrounds another vertex of the set or another group of vertices. In these examples, providing again involves that the functionalities of the first manipulator are again available to the user, e.g. the user can again perform a NUV displacement of the selected at least one vertex.

The method may further comprise repeating the providing of the first manipulator or providing of the second manipulator depending on whether the pointing device is or not within the at least one picking zone each time the pointing device enters and exits a picking zone of the at least one picking zone.

Providing again the first manipulator when the pointing device returns within the at least one picking zone improves the ergonomic of the method for designing the 3D mesh. Indeed, the switch between the first manipulation mode with the first manipulator and the second manipulation mode with the second manipulator follows the movements of the pointing device. Thus, the user can use alternatively the first manipulator and the second manipulator for designing the 3D mesh.

In examples, providing S60 the first manipulator may further comprise withdrawing the second manipulator. Withdrawing the second manipulator means that the one or more functions of the second manipulator are not (no more) available to the user, e.g. the user can again not control a displacement of the one or more vertices of the set along one or more directions defined by the global orientation.

In examples, providing S70 the second manipulator may further comprise withdrawing the first manipulator. Withdrawing the first manipulator means that the one or more functions of the first manipulator are not (no more) available to the user, e.g. the user can again not control a displacement of each vertex of the set along one or more NUV directions.

In examples, providing the first manipulator may comprise displaying the first manipulator on the graphical user interface.

In examples, providing the second manipulator may comprise displaying the second manipulator on the graphical user interface.

Withdrawing the first or second manipulator may comprise removing from the graphical user interface the display of the first or second manipulator. graphical user interface The withdrawing of the first or second manipulator improves the ergonomic for the user. Indeed, the user no longer uses the second manipulator (respectively the first manipulator) when the user uses the first manipulator (respectively the second manipulator). Thus, withdrawing the first manipulator (or the second manipulator) avoids manipulation errors since only one manipulator is provided at the same time. Moreover, withdrawing the first manipulator (or the second manipulator) unloads the screen display, which also improves the ergonomic since only relevant information is displayed on the graphical user interface.

In examples, providing 560 the first manipulator may further comprise determining the vertex of the set that is the closest to the pointing device and providing the first manipulator to the determined vertex. Providing the first manipulator to the determined vertex means that the NUV directions of the first manipulator are the NUV directions of the determined vertex. Thus, the NUV direction are the UV directions of the determined vertex and the normal N direction at the determined vertex. For determining the vertex of the set that is the closest to the pointing device, the method may e.g. calculate the distance between the pointing device and each vertex of the set. The distance may be calculated based on a projection plane. The projection plane may be the screen on which the 3D mesh is displayed when the pointing device is a 2D pointing device. Alternatively, the distance may be the spatial distance (e.g. the Euclidean distance) between the pointing device and each vertex of the set when the pointing device is a 3D pointing device. More generally, the expression "the vertex of the set that is the closest to the pointing device" involves the selection of a vertex based on a distance between the vertex and the pointing devices, and any type of distance can be used.

Providing the first manipulator to the vertex that is the closest to the pointing device improves user interactions for switching back and forth the first and second manipulators. Indeed, the user can select the vertex to which the first manipulator will be provided. For instance, the user can move the pointing device close to a vertex of the set and the first manipulator is provided to this vertex (one could say associated to this vertex). This allows the user to use the first manipulator associated to the different vertices of the one or more vertices. The user can e.g. move the pointing device close to a first vertex of the set and the method will thus provide the first manipulator associated to this first vertex. With the first manipulator associated to the first vertex, the user can perform a first displacement of the one or more vertices. Then, the user can move the pointing device close to a second vertex of the set and the method will thus provide the first manipulator associated to this second vertex. With this second manipulator associated to the first vertex, the user can perform a second displacement of the one or more vertices. The user can therefore perform iteratively a displacement of the one or more vertices of the set using the first manipulator of the different vertices of the set.

In examples, the method may further comprise repeating the computing of the at least one picking zone during or after each displacement of the one or more vertices of the set. "Repeating the computing" means that the method computes again the at least one picking zone based on the current position of the one or more vertices of the set. For instance, the computing of the at least one picking zone may be repeated after each displacement of the one or more vertices of the set by the user, e.g. after that the user uses one of the manipulator for controlling a displacement of the one or more vertices or after that the user move the orientation and/or location of the display of the 3D mesh on the screen. Alternatively, the computing of the at least one picking zone may be continuously performed, i.e. the picking zone is "instantaneously" recalculated for each displacement of the vertices of the set.

Repeating the computing of the at least one picking zone improves the selection of the first manipulator when the second manipulator is provided, and vice versa. Indeed, after each displacement of the one or more vertices of the set, the computed at least one picking zone may no longer surrounds each vertex of the set. For instance, the one or more vertices may be displaced out of the at least one picking zone. Thus, repeating the computing of the at least one picking zone allows correcting the location of the at least one picking zone, which improves the ergonomic for the user since the method takes therefore into account the real situation that is displayed on the screen (i.e. the real current position of the one or more vertices of the mesh after the displacement).

In examples, the selecting, with the pointing device, of the one or more vertices of the 3D mesh may be performed by:
  user interacting with the pointing device on at least one vertex of the mesh, thereby selecting the at least one vertex of the mesh; and/or
  user interacting with the pointing device on at least one edge of the mesh, thereby selecting the two vertices of the at least one edge; and/or
  user interacting with the pointing device on at least one face of mesh, thereby selecting the vertices that belong to the at least one face.

Hence, any combination of one or more of these user interactions may be used for doing the selection.

For instance, the selection may be performed by user interacting with the pointing device on at least one vertex. The user may e.g. move the pointing device on or near a first vertex that the user wishes to select. The user may confirm the selection of the first vertex with a click of a button of the pointing device (or a touch if the screen is touch sensitive). At this time, the set comprises only a single vertex (the first vertex). The user may then select a second vertex to complete the set. The selection of the second vertex may be performed as for the first vertex. By iteratively performing the selection of each vertex, the user may complete the set of selected vertices. The user may also select several vertices at the same time using a drag and drop operation with the pointing device.

The selection may also be performed by user interacting with the pointing device on at least one edge of the mesh, thereby selecting the two vertices of the at least one edge. The selection of the at least one edge of the mesh may be performed as the selection of the vertex previously detailed. When the user selects the at least one edge, the method adds each vertex of the at least one edge to the set of selected vertices. For instance, if the user selects a first edge, the method automatically adds the two vertices of this first edge (i.e. the two vertices at the ends of the first edge) to the set of selected vertices. The user may iteratively select edges for adding the vertices of the edges to the set of selected vertices or may also select several edges at the same time using a drag and drop operation with the pointing device.

The selection may also be performed by user interacting with the pointing device on at least one face of the mesh, thereby selecting the vertices that belong to the at least one face. The selection of the at least one face of the mesh may be performed as the selection of the vertex or edge previously detailed. When the user selects the at least one face, the method adds each vertex of the at least one face to the set of selected vertices. For instance, if the user selects a first face, the method automatically adds the vertices of this first face (i.e. the vertices of each edge that belongs to the face) to the set of selected vertices. The user may iteratively select faces for adding the vertices of the edges to the set of selected vertices or may also select several faces at the same time using a drag and drop operation with the pointing device.

The selection of the one or more vertices is therefore improved. Indeed, the user only needs to select geometrical elements (e.g. an edge or a face) for automatically selecting the vertices of these geometrical elements. Thus, the number of user interaction for selecting the one or more vertices is reduced, which improves the efficiency of the method.

In examples, the first manipulator may comprise at least one graphical element representing one of the NUV directions. Each of the at least one graphical element may be any graphical representation that shows the NUV direction. For instance, each of the at least one graphical element may be any form pointing on the NUV direction, such as a line or an arrow pointing on the NUV direction. The at least one graphical element may control a displacement of at least one vertex of the set along the NUV direction represented by the at least one graphical element. This means that the user can user interact with the pointing device with one of the at least one graphical element, and in reaction a displacement function may be executed. For instance, the user may interact on a graphical element by positioning the pointing device on or adjacent to a graphical element and performing a click on a button of the pointing device (or a touch on one or the NUV direction if the screen is touch sensitive). The user interaction on the graphical element may trigger a displacement function along the direction that the graphical element represents. The displacement function may e.g. displace the one or more vertices along the direction that the graphical element represents with a distance length proportional to a move of the pointing device. The user may thus control the displacement of the one or more vertices using the displacement function by performing, after user interacting with the graphical element, a move of the pointing device. For instance, the user may maintain a click (or a touch on the screen) on or near to a graphical element and move the pointing device (or a finger slide on the screen) in a direction for displacing the one or more vertex along the direction that the graphical element represents. The one or more vertices may be displaced with a displacement length that is proportional to the distance of the move of the pointing device. For instance, the distance of the pointing device may be the distance of the projection of the move of the pointing device on the direction along which the one or more vertices are displaced. The displacement function may be deactivated after that the one or more vertices are displaced. For instance, the displacement function may be deactivated when the user releases the click of the button (or detaches the finger on the screen).

In examples, after the providing of the first manipulator, the method may further comprise user interacting with the at least one graphical element of the first manipulator, e.g. the user may interact with one the at least one graphical element. Then, the method may comprise displacing the at least one vertex of the set along the NUV direction in response to a movement of the pointing device, e.g. with the displacement function triggered when the user interacts with a graphical element. The computed at least one picking zone may be deactivated during the movement. This means that the at least one picking zone may be deactivated when the displacement function is triggered.

The method may further comprise, for each vertex of the set with no NUV direction that is the same as the NUV direction represented by the at least one graphical element, displacing the vertex along one of its NUV direction that is the closest to the NUV direction represented by the at least one graphical element.

Figure 24:
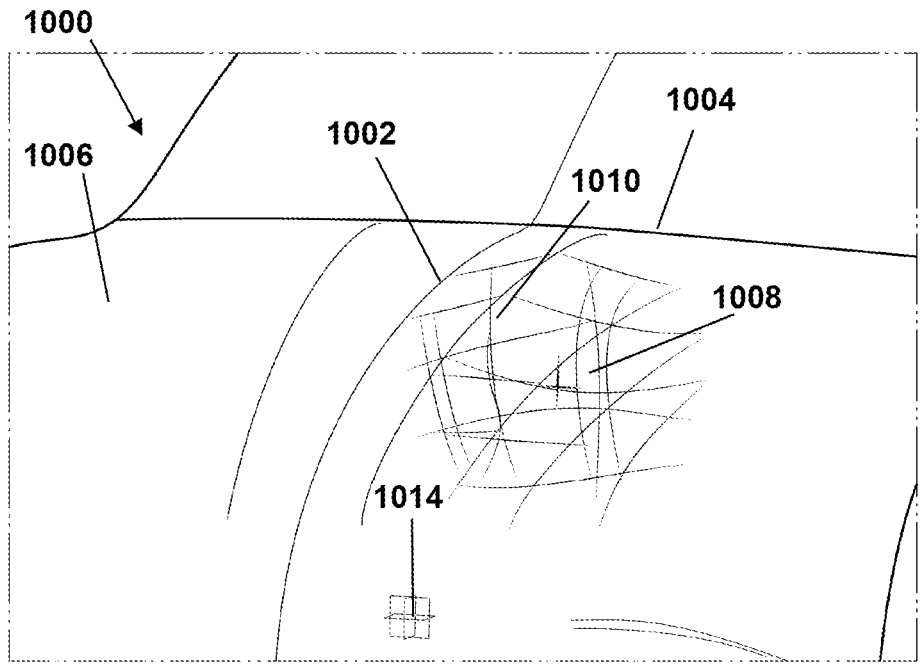
FIGS. 24, 25, 26 and 27 illustrate an example of the method for designing a 3D mesh representing a car body.
Figure 25:
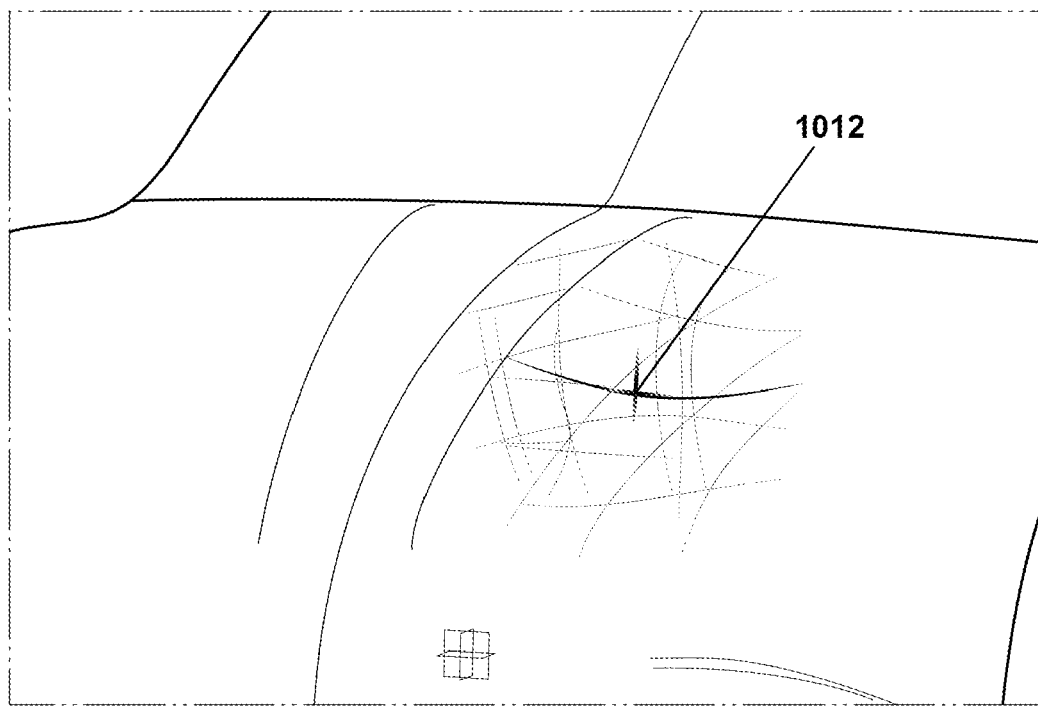

Displacing the vertices of the set along NUV directions that are the closest to the NUV direction represented by the at least one graphical element improves the design of the 3D mesh. Indeed, it allows modifying several vertices of the mesh together, which is particularly useful when the 3D mesh comprises flux lines. Flux lines of the 3D mesh are groups of vertices and edges that form a relatively linear portion of the mesh. The flux lines of a 3D mesh are lines that follow the lines of the design of the represented 3D object. For instance, the flux lines of a car body are the lines that are parallel to the direction of the car when the car moves (an example of such a flux line is illustrated in FIG. 24). The mesh is generally regular along these flux lines, and it is therefore important to modify the mesh without destructing these flux lines. In this context, displacing together the vertices of the set along NUV directions that are the closest allows modifying the vertices of flux lines without destructing the regularity of the mesh, and thus modifying the design according to the flux lines of the 3D object. This therefore greatly improves design modification.

The method may further comprise updating the position of the first manipulator based on a new position of the at least one vertex of the set along the NUV direction that is displaced in response to a movement of the pointing device. For instance, the position of the first manipulator may be updated after each displacement of the one or more vertices upon user interaction with the first manipulator. The position of the first manipulator may also be updated after each change of the viewpoint on the screen (e.g. when the user changes the relative position of the 3D mesh with the screen). The position of the first manipulator may also be updated continuously, e.g. the first manipulator may follows the position of the at least one vertex when their position change.

The method may further comprise, for each vertex of the set with no NUV direction that is the same as the NUV direction represented by the at least one graphical element, displaying a graphical element representing the NUV direction of the vertex that is the closest to the NUV direction represented by the at least one graphical element of the first manipulator. The graphical element may be a line or an arrow that indicates the NUV direction. The graphical element may be positioned such that one end of the graphical element is on or near the vertex and the other end points in the NUV direction.

The second manipulator may be a robot. The "robot" is a manipulator represented by the global orientation and having 3 axes (X, Y, Z). The user can use any of its 3 axes to manipulate the one or more vertices along the directions defined by the axis system. The axis system of the robot may e.g. be a global axis system 312 of the 3D scene, such as a global axis system of the 3D object or of a product comprising the 3D object that is modified. The user can also interact with the "robot" for rotating and/or scaling the one or more vertices of the set. This other kind of user interaction with the "robot" allows performing rotation or affinities of the vertices of the mesh. Thus, the claimed invention allows working with different kinds of transformation of the one or more vertices of the set, for instance the translation along the NUV direction with the first manipulator and the rotation or affinities with the second manipulator, which further improves the ergonomics for the user.

The computing of the at least one picking zone may comprise computing one picking zone for each vertex of the set. Alternatively or additionally, the computed at least one picking zone may be a delimited surface such as a circle when the pointing device is a two-dimensional (2D) pointing device, or may be a volume such as a sphere when the pointing device is a 3D pointing device FIGS. 11 and 12 show examples of picking zones when the pointing device is a 2D or 3D pointing device.

Figure 11:
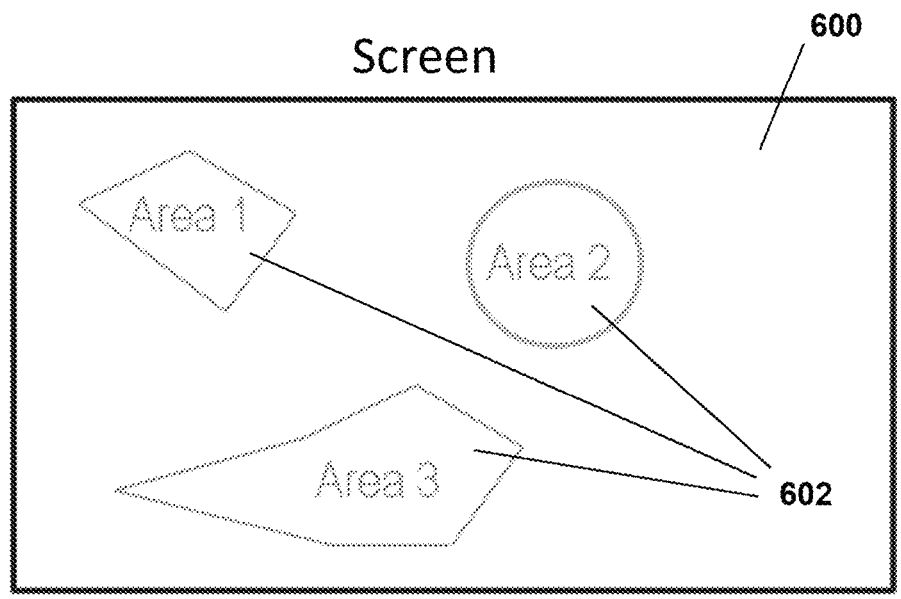
FIGS. 11 and 12 show examples of picking zones when the pointing device is a 2D or 3D pointing device.
Figure 12:
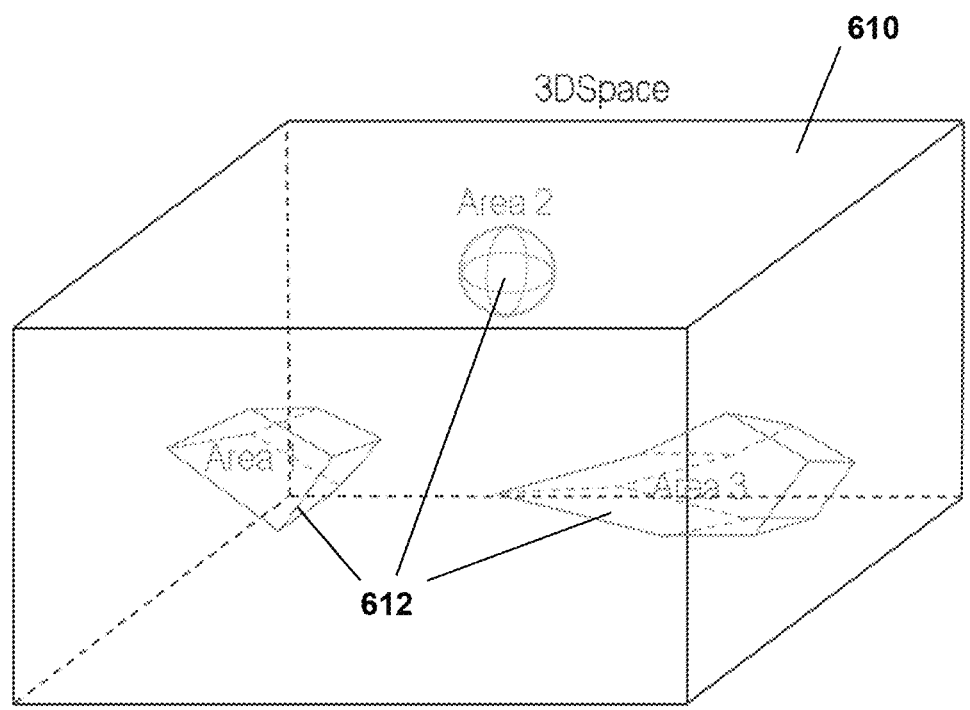

FIG. 11 show examples of the picking zone 602 when the pointing device is a 2D pointing device. In these examples, the graphical user interface is a 2D, e.g. the graphical user interface is displayed on a 2D screen 600. Three picking zones 602 labeled Area 1, Area 2 and Area 3 are represented. A picking zone may delimit any zone of the 2D screen 600. In the examples of FIG. 11, each picking zone 602 may delimit an area of the 2D graphical user interface and may be of any shape and size, e.g. the Area 1 delimited by a circle, the Area 2 delimited by a quadrilateral or any polygon on the screen 600 as shown with the Area 3.

In examples, if the picking zone is delimitated by a circle, the circle's center may be the projection onto the screen of the vertex that the picking zone surrounds. The circle's radius may be pixel fixed (e.g. 60 pixels), e.g. by the user and/or the system.

In examples, a picking zone may a union of two or more picking zone. For instance, when the at least one picking zone surrounds geometries that are superposed on 2D GUI, the method may consider only the union of the superposed areas. For instance, if the method computes two picking zones that are each a circle, and the two picking zones are partially superposed, the method may consider the zone defined by the union of the two circles.

FIG. 12 show examples of picking zone 612 when the pointing device is a 3D pointing device. In these examples, the graphical user interface is a 3D space 610. Three picking zones 602 labeled Area 1, Area 2 and Area 3 are represented. Each of the at least picking zone may delimit any volume of the 3D space 610. As illustrated in this figure, each of the at least one picking zone 612 may delimit e.g. a sphere, a prism or any particular volume of the 3D space 610. If the picking zone is delimited by a sphere, the sphere's center may be the vertex that the sphere surrounds. The sphere's radius may be the 3D equivalent of a number of pixels (e.g. an equivalent of 60 pixels as in the case of a 2D pointing device). As for the previous example when the pointing device is a 2D pointing device, the method may consider the union of the volume of each of the computed at least one picking zone.

FIGS. 13 to 16 show an example of displacement of a vertex along an NUV direction in response to a movement of the pointing device.

Figure 13:
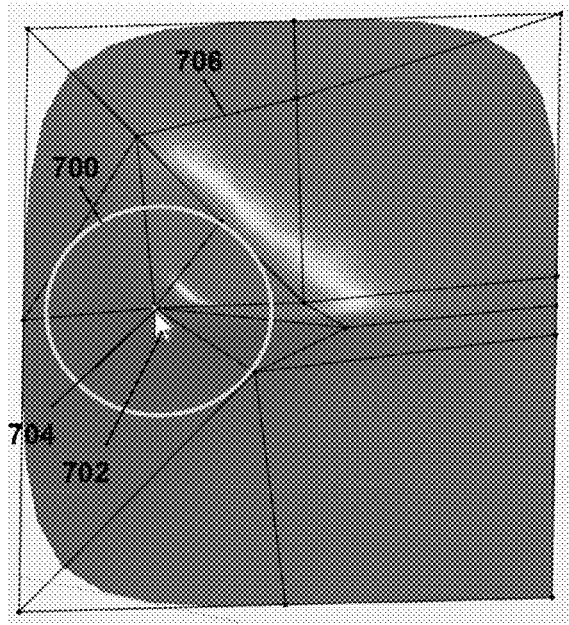
FIGS. 13, 14, 15 and 16 show an example of displacement of a vertex along an NUV direction in response to a movement of the pointing device.

As illustrated in FIG. 13, a vertex 704 of the mesh is selected with the pointing device 702. As a result of the selection of the vertex 704, a picking zone 700 that surrounds the selected vertex 704 is computed. In this example, the computed picking zone 700 is a circle on the screen. In FIGS. 13 to 16, picking zones are represented for the sake of explanation only. Picking zones may be not visible (that is, not displayed) to the user, or on the contrary picking zones may be displayed to the user.

Figure 14:
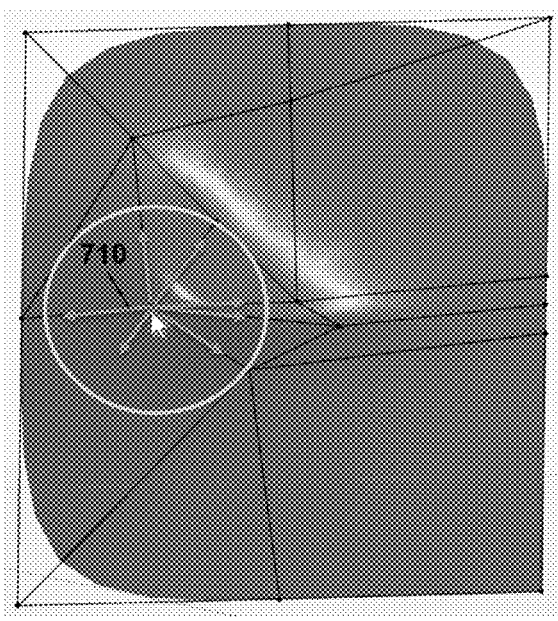

After the computing of the picking zone 700, the pointing device is still within the picking zone 700 as the pointing device has been moved close to the vertex 704 at the time of selection. A first manipulator 710 is displayed, as illustrated in FIG. 14. In the example of FIG. 14, the first manipulator comprises graphical elements (seven graphical elements in this example) representing each of the seven NUV directions of the vertex 704. Each graphical element controls a displacement of the vertex 704 along the NUV direction represented by the graphical elements. Each graphical element may be represented as an arrow starting from the vertex 704 to which it belongs and directed in the NUV direction it represents. The arrow directly indicates an orientation of the direction the graphical element represents. When the user interacts with one the arrows, the displacement function may displace the selected one or more vertices along the direction the graphical element represents in the orientation of the direction that the arrow indicates. The displacement function may also displace the selected one or more vertices along the direction in the orientation opposite to the orientation indicated by the arrow.

Figure 15:
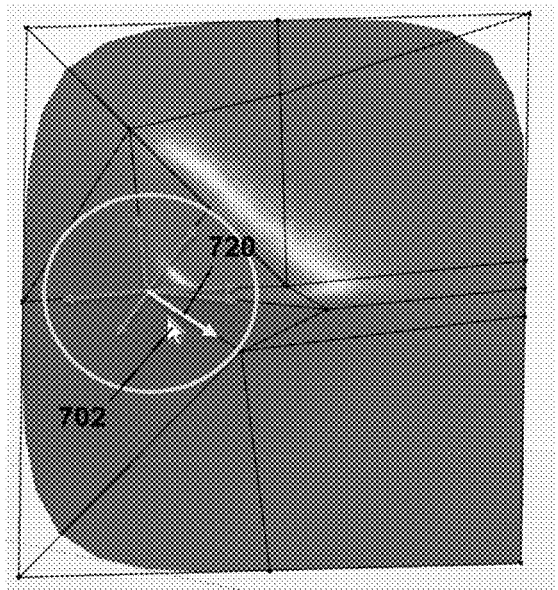

After the display of the first manipulator, the user interacts with a graphical element 720 of the first manipulator, as illustrated in FIG. 15. In FIG. 15, the user interacts with the graphical element 720 by positioning the pointing device 702 close to the graphical element 720. For instance, the distance between the pointing device 702 and the graphical element 720 may be lower than a distance limit. The distance limit may e.g. be a number of pixels on the graphical user interface. When the user interacts with a graphical element, this graphical element 720 may be e.g. by highlighted; therefore, the user is aware that the user action will be carried out on the graphical element 720.

Figure 16:
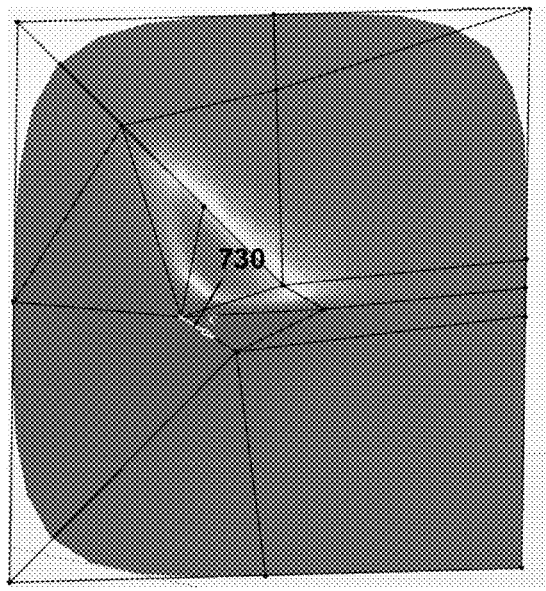

The user can displace the vertex 704 along the NUV direction 730 represented by the graphical element 720 in response to a movement of the pointing device, as illustrated in FIG. 16. For instance, the user may interact with the graphical element 720 by clicking on a button of a mouse when the pointing device is a mouse. Then, the user may control the displacement of the vertex 704 by moving the mouse, and the vertex 704 may be displaced along the NUV direction 730 with a distance proportional to the move distance of the mouse, e.g. a coefficient of proportionality may be applied between the two distances. In examples, the computed at least one picking zone 700 may be deactivated during the movement. This means that the method may do not perform the provision of the second manipulator even if the pointing device does not remain within the picking zone 700. This allows freely modifying the position of the vertex 704 with the first manipulator by avoiding limiting the user to movements of the pointing device 702 inside the picking zone 704 during the modification.

Figure 17:
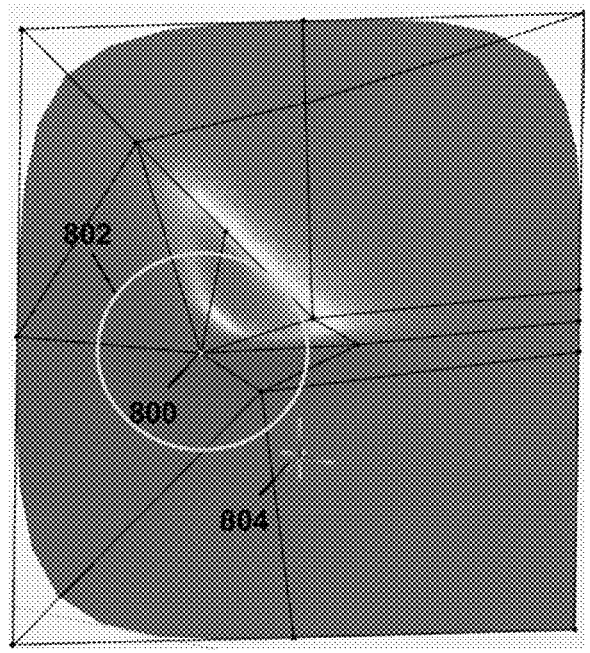
FIGS. 17 and 18 shows an example of providing a second manipulator if the pointing device is not maintained within the picking zone and withdrawing the first manipulator.
Figure 18:
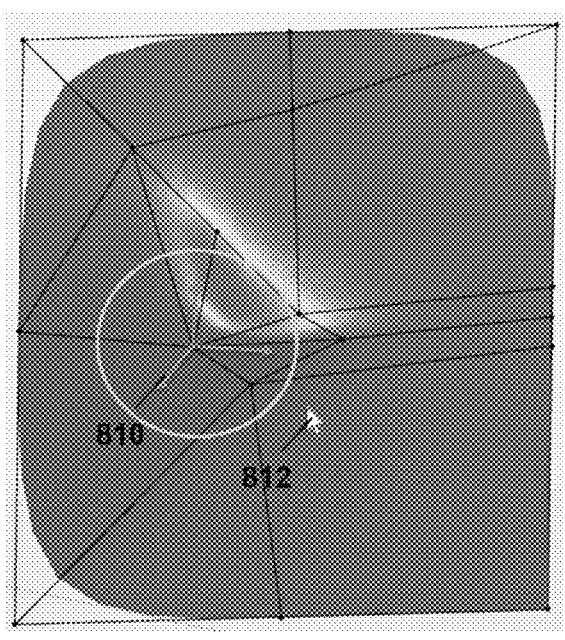

FIGS. 17 and 18 shows an example of providing a second manipulator if the pointing device is not maintained within the picking zone and withdrawing the first manipulator.

The example of FIG. 17 is described following the situations illustrated in FIGS. 13 to 16, i.e. after that one vertex 800 has been selected, the picking zone 802 has been computed and the first manipulator has been provided. At this time, the user moves the pointing device outside the picking zone 802, as illustrated in FIG. 17. It is to be understood that the user has performed no user interaction on the displayed first manipulator. Thus, it is determined that the pointing device is no more in the picking zone, that is, the pointing device has not been maintained in the picking zone. As illustrated in FIG. 17, the method thus withdraws the first manipulator (i.e. remove the display of the first manipulator).

In examples, the appearance 804 of the pointing device may be modified for indicating that the pointing device is outside the picking zone. The appearance 804 of the cursor may also be modified temporary. As illustrated in FIG. 18 in relation with FIG. 17, the appearance 804 of the cursor may be modified after that the pointing device leaves the picking zone 802, and may be modified again 812 after a predefined time (as illustrated in FIG. 18 where the appearance of the pointing device becomes a cursor 812 again).

As a result of the termination, the second manipulator 810 is provided for controlling the displacement of the vertex 800 along three directions defined by the global orientation. In FIG. 18, the second manipulator 810 is displayed on the graphical user interface at the location of the vertex 800. In FIG. 18, the second manipulator 810 is a robot. The user may interact with one of the three directions defined by the global orientation for displacing the vertex 800 along one of these directions. In examples, only this direction may be displayed on the graphical user interface, e.g. at the location of the pointing device or at the location of the vertex 800. This improves the ergonomic since only relevant information is displayed on the graphical user interface.

Figure 19:
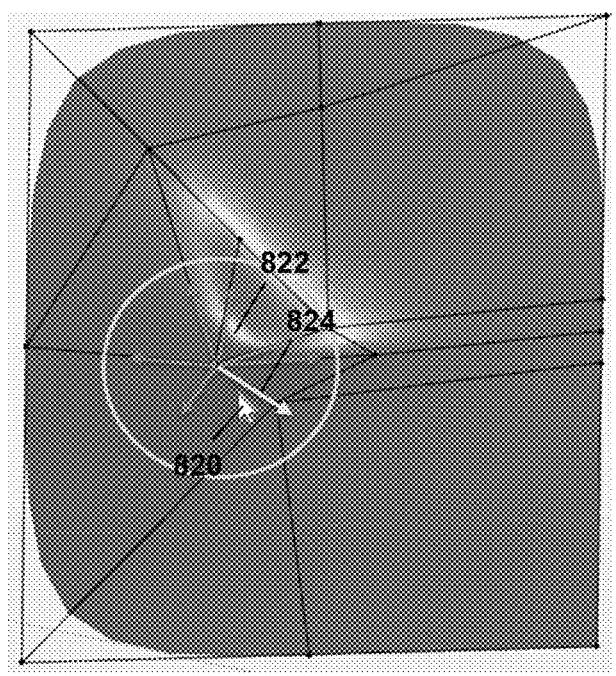
FIG. 19 shows an example of providing the first manipulator after the providing the second manipulator when the pointing device is again within the picking zone and withdrawing the second manipulator.

Referring now to FIG. 19, it is discussed an example of providing the first manipulator after the providing the second manipulator when the pointing device is again within the picking zone and withdrawing the second manipulator. For instance, after providing the second manipulator as illustrated in FIG. 18, the user moves the pointing device 820 inside the picking zone 802. The method thus provides again the first manipulator 822 and withdrawn the second manipulator 810. As illustrated in FIG. 19 with reference to FIG. 18, the method displays the first manipulator 822 and removes the display of the second manipulator 810. In this example, the method highlights the NUV direction 824 of the first manipulator that is the closest to the pointing device.

Figure 20:
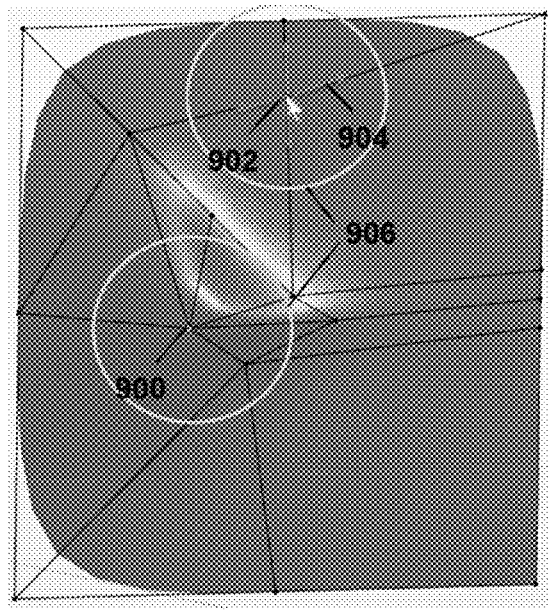
FIG. 20 shows an example of selecting with the pointing device a first vertex and a second vertex of a 3D mesh.

FIG. 20 shows an example of selecting with the pointing device a first vertex and a second vertex of a 3D mesh.

The example of FIG. 20 is described following the situations illustrated in FIG. 13, i.e. after that one vertex 900 has been selected (referred to as the first vertex 900). Now, the user selects with the pointing device a second vertex 902 of the mesh, as illustrated in FIG. 20. The set of one or more vertices therefore comprise two vertices (the selected first 900 and second 902). Two picking zones 906 are computed, i.e. one picking zone for each vertex. The two picking zones surround the two vertices 900, 902 of the set.

Figure 21:
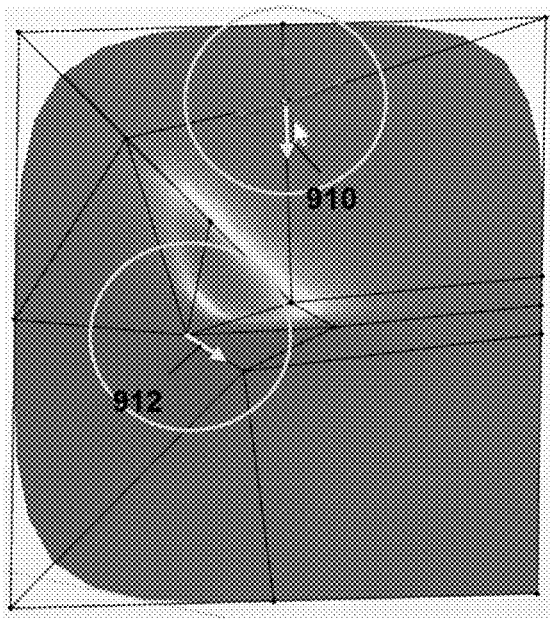
FIG. 21 shows an example displacing the second vertex along one of its NUV directions that is the closest to the NUV direction along which the first vertex is displaced.

The closest vertex (of the set) to the pointing device is determined. As the second vertex 902 has been selected after the first vertex 900, the closest vertex to the pointing device is the second vertex 902. Thus, the method then provides the first manipulator 902 to the second vertex 902. The first manipulator 902 comprises one graphical element representing each of the NUV directions of the second vertex 902 (i.e. four graphical elements in this example). Each graphical element controls a displacement of the second vertex 902 along the NUV direction represented by the at least one graphical element (here by arrows). Then, the method comprises user interacting with one graphical element 910 of the first manipulator, as illustrated in FIG. 21. In this example, the user interacts with the graphical element 910 by positioning the pointing device close to the graphical element 910.

It is now discussed examples when at least one vertex of the set does not have a NUV direction that is the same as the NUV direction 910 selected upon user action. In these example, each vertex of the set with no NUV direction that is the same as the NUV direction represented by the at least one graphical element is displaced along one of its NUV direction that is the closest to the NUV direction represented by the at least one graphical element. For instance, the similarity between two NUV directions may be calculated by computing the scalar product of two vectors representing each direction. The method may e.g. consider that two NUV directions are "the same" if the scalar product is 1 (i.e. when the directions are equal) or if the scalar product is close to 1 (i.e. the directions are almost equal). The closest NUV direction may be determined by computing the scalar product of each NUV direction and by selecting the NUV direction having the higher scalar product with the NUV direction represented by the at least one graphical element.

Referring back to FIG. 20, the first vertex 900 has no NUV direction of the first vertex 900 that is the same as the NUV direction 910. Thus, the NUV direction that is the closest to the NUV direction 910 is determined. For instance, the method may determine the NUV direction that is the closest to the NUV direction 910 by computing the scalar product of each of the NUV directions of the first vertex 900 with the NUV direction 910. The NUV direction that is the closest to the NUV direction 910 may e.g. be the NUV direction having the larger scalar product with the NUV direction 910. In this example, the NUV direction 912 of the first vertex 900 is the direction that is the closest to the NUV direction 910. The first vertex 912 is thus displaced along the determined direction 912. For each vertex of the set with no NUV direction that is the same as the NUV direction represented by the at least one graphical element, a graphical element may be displayed that represents the closest NUV direction to the NUV direction selected on a graphical element of the first manipulator. In this example, one may thus display a graphical element representing the NUV direction 912. The method thus displaces the second vertex 902 and the first vertex 900 each along their respective NUV directions (910 for the second vertex and 912 for the first vertex). Each of the two graphical elements 910, 912 representing the two NUV direction (910 and 912) are highlighted on the graphical user interface (e.g. by making semi-transparent the other NUV directions that are displayed).

Figure 22:
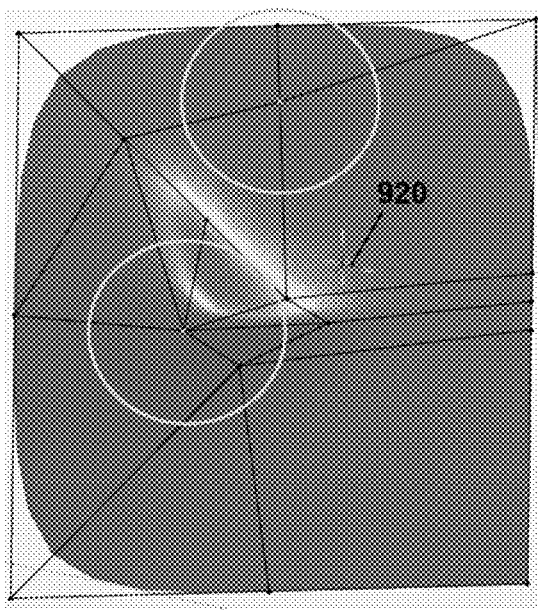
FIGS. 22 and 23 show an example of providing the second manipulator if the pointing device is not maintained within the picking zone computed for the selected vertices of FIG. 20 and withdrawing the first manipulator.
Figure 23:
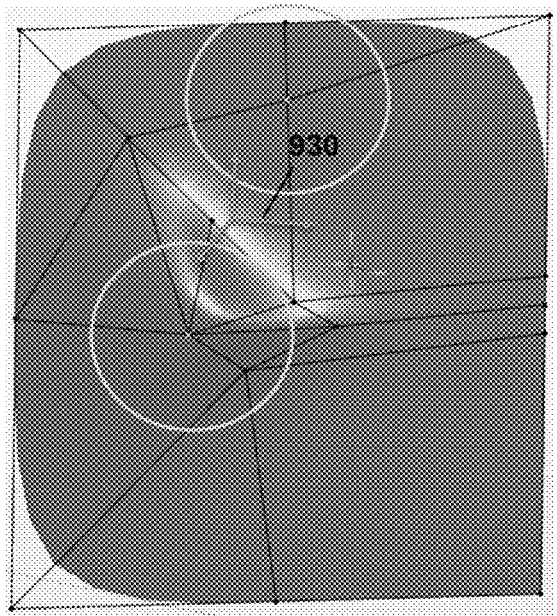

FIGS. 22 and 23 show an example of providing a second manipulator if the pointing device is not maintained within the picking zone computed for the selected vertices of FIG. 20 and withdrawing the first manipulator.

The example of FIG. 22 is described following the situations illustrated in FIGS. 20 to 21, i.e. after that the first and second vertices 900, 902 have been selected, the picking zone 906 has been computed and the first manipulator 904 has been provided to the second vertex 902. At this time, the user moves the pointing device 920 outside the two picking zones 906, as illustrated in FIG. 22. Still in reference to FIG. 22, the user moves the pointing device outside the picking zone computed for the second vertex 904 (the pointing device was inside this picking zone). It is determined that the pointing device is not maintained in the picking zone. The appearance of the pointing device 920 may be modified for indicating that the pointing device is outside the two picking zones 906. Consequently, the second manipulator 930 is provided for controlling the displacement of the first and second vertices 900, 902 along the three directions defined by the global orientation. The second manipulator 810 is displayed on the graphical user interface at a location corresponding to the barycenter of the position of the vertices 900, 902 of the set, as illustrated in FIG. 23. Now, the user may interact with one of the three directions defined by the global orientation for displacing the vertices 900, 902 of the set along this direction.

Now, if the pointing device returns in the picking zone of the first vertex 900, the method provides again the first manipulator to the first vertex 900 and withdrawn the second manipulator 930. It is to be understood that the user has performed no user interaction on the displayed second manipulator.

The provision of the first manipulator may be repeated after each move of the pointing device in a different picking zone. For instance, if the user successively moves the pointing device in different picking zones belonging to different vertices (e.g. 900 and 902 in the example of FIGS. 20-23), the method successively provides the first manipulator to the different vertices, and, after each successive move in the different picking zones, withdrawn the provided first manipulator after each new provision of the first manipulator.

FIGS. 24 to 27 illustrate an example of the method for designing a 3D mesh 1008 representing a car body 1000. The car body 1000 comprises a symmetry axis 1002. References to the flowchart of FIG. 1 are indicated. The 3D mesh 1008 representing the car body 1000 is displayed S10 and the global orientation 1014 is provided S10.

With the pointing device, the vertices of a flux line 1010 of the mesh are selected S20, thereby forming a set of vertices. At this time, the picking zones that surround each of the vertices of the set are computed. In this example, the method computes a picking zone for each of the vertices. A second manipulator 1012 (S70) is displayed as the pointing device is not inside the computed picking zones.

Figure 26:
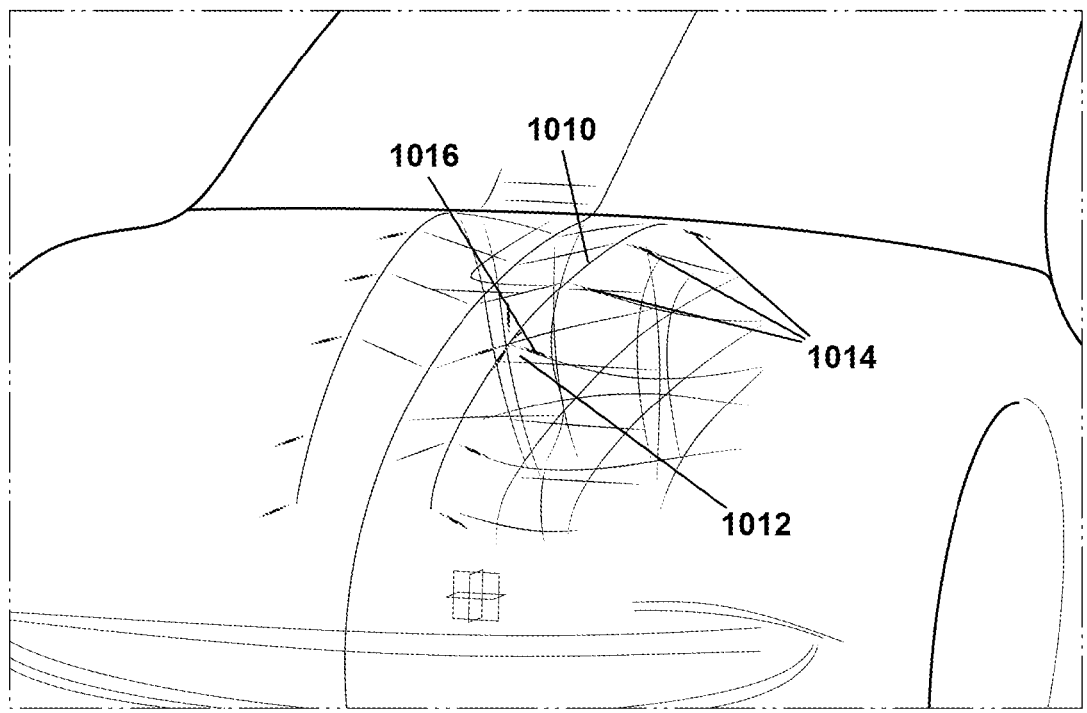

Turning now to FIG. 26, the method determines (S50) that the pointing device is again inside the picking zone. The first manipulator is thus provided again (S60). The method determines that the vertex 1012 of the set is the closest to the pointing device, and thus provides the first manipulator to this vertex 1012. The first manipulator comprises one graphical element representing each of the NUV directions of this vertex 1012 (i.e. four graphical elements representing the four incident edges of the vertex 1012 and one graphical element of the normal N direction). Each graphical element of the first manipulator controls a displacement of the vertex 1012 along the NUV direction represented by the at least one graphical element.

Then, the method comprises user interacting S80 with one graphical element 1016 of the first manipulator. For each vertex of the set with no NUV direction that is the same as the NUV direction represented by the graphical element 1016, the vertex is displaced along one of its NUV direction that is the closest to the NUV direction represented by the at least one graphical element. In this example, other vertices of the flux line have no NUV direction that is the same as the NUV direction represented by the graphical element 1016. Thus, the method determines, for each other vertices of the flux line, the NUV direction 1014 that is the closest to the NUV direction represented by the graphical element 1016, e.g. by computing, for each other vertices of the flux line, the scalar product of each NUV direction with the NUV direction 1014 and selecting, for each other vertices of the flux line, the NUV direction having the larger scalar product. As illustrated in FIG. 26, the determined NUV direction 1014 of each other vertices of the flux line are highlighted, e.g. by displaying a graphical element representing each of the determined NUV direction 1014.

Figure 27:
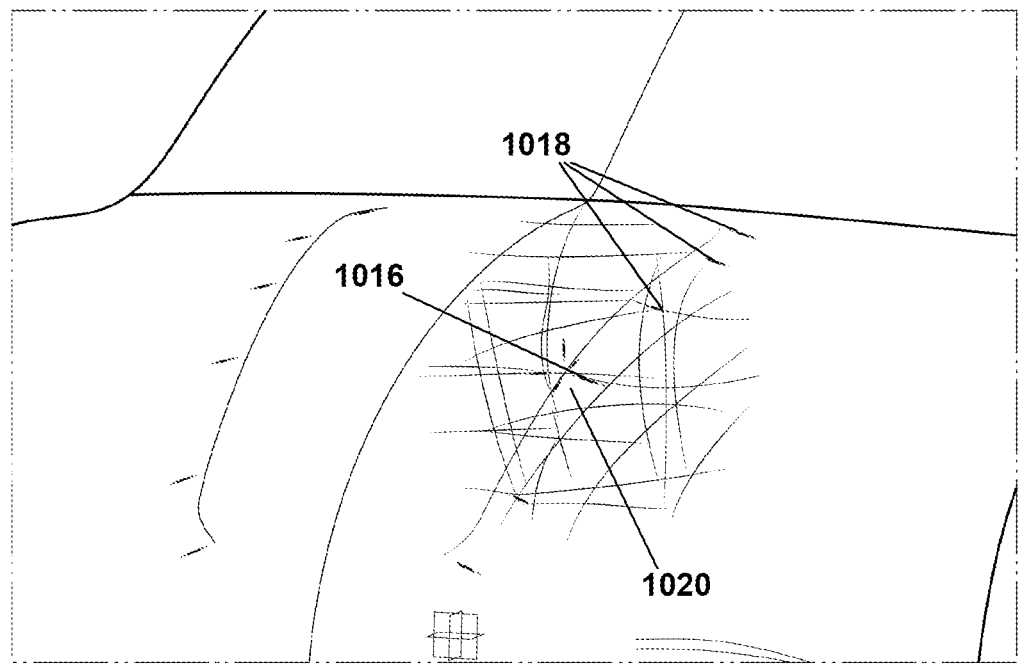

As illustrated in FIG. 27, the vertex 1012 of the set is displaced by the displacement function along the NUV direction represented by the graphical element 1016 in response to a movement of the pointing device. Other vertices of the flux line 1018 are displaced by the displacement function along their respective NUV directions 1014 that are the closest to the NUV direction represented by the graphical element 1016. After the displacement, the position of the first manipulator is updated based on the new position of the vertex 1020. The position of other graphical elements 1018 displayed for highlighting the determined NUV directions 1014 of each other vertices of the flux line 1010 are also updated based on the new positions of the other vertices of the flux line 1010.

The provision of the first manipulator may be repeated. For instance, if the user moves the pointing device in another picking zone belonging to another vertex than the vertex 1012, the method provides the first manipulator to this another vertex. The first manipulator may comprise one graphical element representing each of the NUV directions of this another vertex. At this time, the method may withdraw the first manipulator provided to the vertex 1012 (or "deactivate" the first manipulator of the vertex 1012). Since the vertex 1012 now belongs to the other vertices of the flux line 1010, the method may display the first manipulator of the vertex 1012 in a "degraded" version. For instance, the "degraded" version of the first manipulator of the vertex 1012 may comprise a single graphical element that represents the NUV direction that is the closest to the NUV direction represented by a graphical element of the newly provided first manipulator if the user interact with this graphical element (as for the other vertices of the flux line 1010).

Thus, the display of the first manipulator 1016 for the vertex for which the pointing device is in its picking zone, and the display of a graphical element for the other vertices of the set 1014, may be successively updated after each move of the pointing device in a new picking zone belonging to a new vertex of the set. After each move, the method may provide the first manipulator 1016 to the new vertex and display a graphical element 1014 for the vertex whose pointing device has left the picking area.

In the example of FIG. 26, the determined NUV direction 1014 of each other vertices of the flux line 1010 are highlighted by displaying a graphical element representing each of the determined NUV direction 1014. In other examples, the determined NUV direction 1014 of each other vertices of the flux line may not be highlighted, e.g. the method may not display graphical elements for other vertices that the vertex 1012 (i.e. only for the first manipulator provided to the vertex 1012). In other examples, each NUV direction of each other vertices of the flux line may be highlighted, e.g. the method may display a graphical element for each NUV direction of each other vertices of the flux line 1010.

Figure 28:
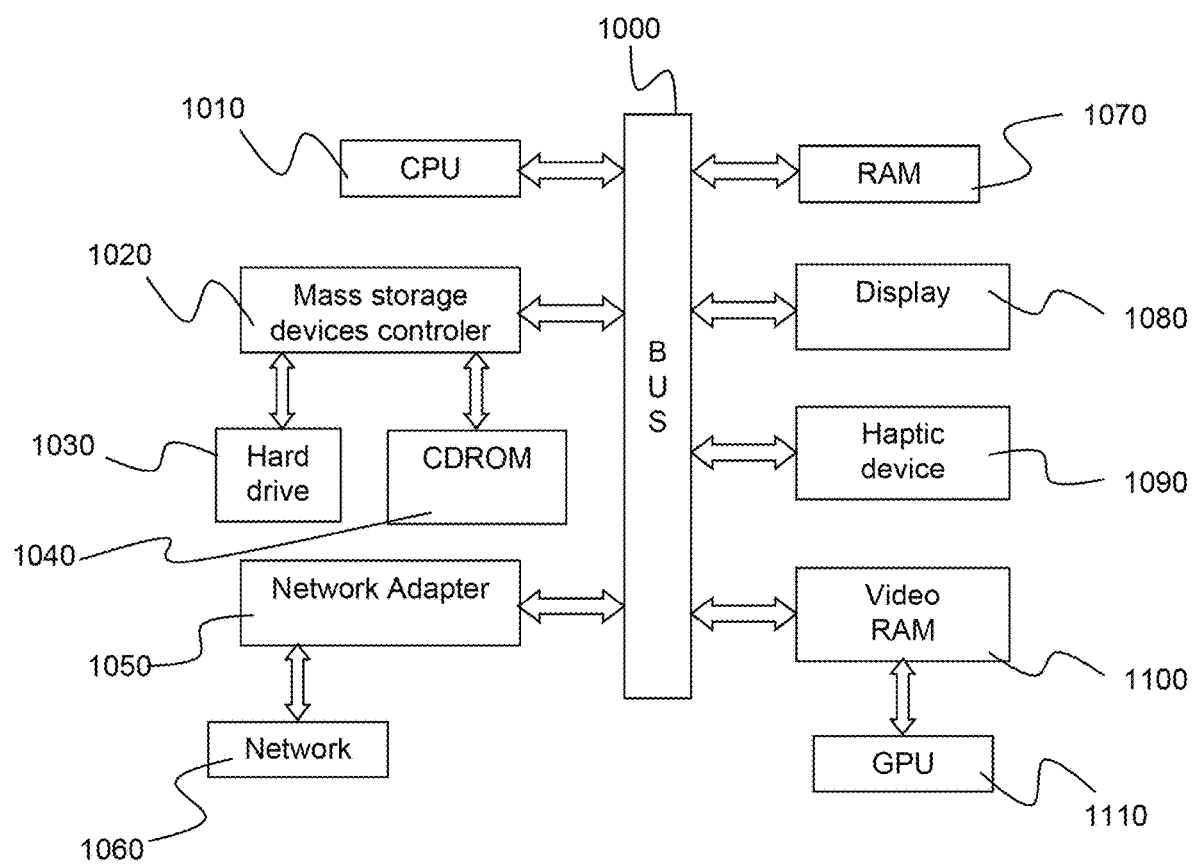
FIG. 28 shows an example of the system.

FIG. 28 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The invention claimed is:

1. A computer-implemented method for designing a three-dimensional (3D) mesh in a 3D scene, the method comprising:
   displaying a 3D mesh in a 3D scene and obtaining a global orientation;
   selecting, with a pointing device, one or more vertices of the 3D mesh, thereby forming a set of one or more vertices;
   computing at least one picking zone that surrounds each vertex of the set;
   providing a first manipulator for controlling a displacement of each vertex of the set along one or more NUV directions;
   determining whether or not the pointing device is maintained within the at least one picking zone; and
   if not, providing a second manipulator for controlling a displacement of the one or more vertices of the set along one or more directions defined by the global orientation,
   wherein the first manipulator comprises at least one graphical element representing one of the NUV directions, the at least one graphical element controlling a displacement of at least one vertex of the set along a NUV direction represented by the at least one graphical element; and
   after the providing of the first manipulator:
   user interacting with the at least one graphical element of the first manipulator;
   displacing the at least one vertex of the set along the NUV direction in response to a movement of the pointing device, the computed at least one picking zone being deactivated during the movement; and
   for each vertex of the set with no NUV direction that is the same as the NUV direction represented by the at least one graphical element, displacing the vertex along one of its NUV direction that is a closest to the NUV direction represented by the at least one graphical element.

2. The computer-implemented method of claim 1, further comprising, after the providing the second manipulator:
   determining that the pointing device is again within the at least one picking zone; and
   providing the first manipulator.

3. The computer-implemented method of claim 2, wherein providing the first manipulator further comprises:
   withdrawing the second manipulator.

4. The computer-implemented method of claim 1, wherein providing the second manipulator further comprises:
   withdrawing the first manipulator.

5. The computer-implemented method of claim 1, wherein providing the first manipulator further comprises:
   determining the vertex of the set that is a closest to the pointing device; and
   providing the first manipulator to the determined vertex.

6. The computer-implemented method of claim 1, further comprising:
   repeating the computing of the at least one picking zone during or after each displacement of the one or more vertices of the set.

7. The computer-implemented method of claim 1, wherein the selecting, with a pointing device, of one or more vertices of the 3D mesh is performed by:
   user interacting with the pointing device on at least one vertex of the mesh, thereby selecting the at least one vertex of the mesh; and/or
   user interacting with the pointing device on at least one edge of the mesh, thereby selecting two vertices of the at least one edge; and/or
   user interacting with the pointing device on at least one face of mesh, thereby selecting the vertices that belong to the at least one face.

8. The computer-implemented method of claim 1, further comprising:
   updating a position of the first manipulator based on a new position of the at least one vertex of the set along the NUV direction that is displaced in response to a movement of the pointing device.

9. The computer-implemented method of claim 1, further comprising, for each vertex of the set with no NUV direction that is the same as the NUV direction represented by the at least one graphical element:
   displaying a graphical element representing the NUV direction of the vertex that is the closest to the NUV direction represented by the at least one graphical element of the first manipulator.

10. The computer-implemented method of claim 1, wherein the second manipulator is a robot.

11. The computer-implemented method of claim 1, wherein the computing of the at least one picking zone comprises computing one picking zone for each vertex of the set, and/or wherein the computed at least one picking zone is a delimited surface including a circle when the pointing device is a two-dimensional (2D) pointing device, or is a volume such as a sphere when the pointing device is a 3D pointing device.

12. A non-transitory computer readable medium having stored thereon a computer program, which, when executed by a processor, causes the processor to implement a method for designing a three-dimensional (3D) mesh in a 3D scene comprising:
   displaying a 3D mesh in a 3D scene and obtaining a global orientation;
   selecting, with a pointing device, one or more vertices of the 3D mesh, thereby forming a set of one or more vertices;
   computing at least one picking zone that surrounds each vertex of the set;
   providing a first manipulator for controlling a displacement of each vertex of the set along one or more NUV directions;
   determining whether or not the pointing device is maintained within the at least one picking zone; and
   if not, providing a second manipulator for controlling a displacement of the one or more vertices of the set along one or more directions defined by the global orientation,
   wherein the first manipulator comprises at least one graphical element representing one of the NUV directions, the at least one graphical element controlling a displacement of at least one vertex of the set along a NUV direction represented by the at least one graphical element; and
   after the providing of the first manipulator:
   user interacting with the at least one graphical element of the first manipulator;

displacing the at least one vertex of the set along the NUV direction in response to a movement of the pointing device, the computed at least one picking zone being deactivated during the movement; and for each vertex of the set with no NUV direction that is the same as the NUV direction represented by the at least one graphical element, displacing the vertex along one of its NUV direction that is a closest to the NUV direction represented by the at least one graphical element.

13. The non-transitory computer readable medium of claim 12, wherein the method further comprises, after the providing the second manipulator:

determining that the pointing device is again within the at least one picking zone; and providing the first manipulator.

14. The non-transitory computer readable medium of claim 13, wherein providing the first manipulator further comprises:

withdrawing the second manipulator.

15. The non-transitory computer readable medium of claim 12, wherein providing the second manipulator further comprises:

withdrawing the first manipulator.

16. The non-transitory computer readable medium of claim 12, wherein providing the first manipulator further comprises:

determining the vertex of the set that is a closest to the pointing device; and providing the first manipulator to the determined vertex.

17. The non-transitory computer readable medium of claim 12, further comprising:

repeating the computing of the at least one picking zone during or after each displacement of the one or more vertices of the set.

18. The non-transitory computer readable medium of claim 12, wherein the selecting, with a pointing device, of one or more vertices of the 3D mesh is performed by:

user interaction with the pointing device on at least one vertex of the mesh, thereby selecting the at least one vertex of the mesh; and/or user interaction with the pointing device on at least one edge of the mesh, thereby selecting two vertices of the at least one edge; and/or user interaction with the pointing device on at least one face of mesh, thereby selecting the vertices that belong to the at least one face.

19. A system for designing a three-dimensional (3D) mesh in a 3D scene, comprising:

a processor; and a memory with computer code instructions stored thereon, the processor and the memory being configured to implement the computer code instructions by being configured to:

display a 3D mesh in a 3D scene and obtain a global orientation;

select, with a pointing device, one or more vertices of the 3D mesh, thereby forming a set of one or more vertices;

compute at least one picking zone that surrounds each vertex of the set;

provide a first manipulator for controlling a displacement of each vertex of the set along one or more NUV directions;

determine whether or not the pointing device is maintained within the at least one picking zone; and if not, provide a second manipulator for controlling a displacement of the one or more vertices of the set along one or more directions defined by the global orientation, wherein the first manipulator comprises at least one graphical element representing one of the NUV directions, the at least one graphical element controlling a displacement of at least one vertex of the set along a NUV direction represented by the at least one graphical element; and after the providing of the first manipulator:

user interacting with the at least one graphical element of the first manipulator;

displacing the at least one vertex of the set along the NUV direction in response to a movement of the pointing device, the computed at least one picking zone being deactivated during the movement; and for each vertex of the set with no NUV direction that is the same as the NUV direction represented by the at least one graphical element, displacing the vertex along one of its NUV direction that is a closest to the NUV direction represented by the at least one graphical element.

* * * * *